(12) United States Patent
Kaneda et al.

(10) Patent No.: US 11,127,909 B2
(45) Date of Patent: Sep. 21, 2021

(54) PHOTOELECTRIC CONVERSION ELEMENT, MEASURING METHOD OF THE SAME, SOLID-STATE IMAGING DEVICE, ELECTRONIC DEVICE, AND SOLAR CELL

(71) Applicant: SONY CORPORATION, Tokyo (JP)

(72) Inventors: Yukio Kaneda, Kanagawa (JP); Ryoji Arai, Kanagawa (JP); Toshiki Moriwaki, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 352 days.

(21) Appl. No.: 16/085,653

(22) PCT Filed: Mar. 10, 2017

(86) PCT No.: PCT/JP2017/009666
§ 371 (c)(1),
(2) Date: Sep. 17, 2018

(87) PCT Pub. No.: WO2017/163923
PCT Pub. Date: Sep. 28, 2017

(65) Prior Publication Data
US 2020/0295285 A1    Sep. 17, 2020

(30) Foreign Application Priority Data
Mar. 24, 2016   (JP) .............................. JP2016-059977

(51) Int. Cl.
*H01L 51/44* (2006.01)
*G01T 1/36* (2006.01)
*H01L 27/30* (2006.01)

(52) U.S. Cl.
CPC .............. *H01L 51/44* (2013.01); *G01T 1/366* (2013.01); *H01L 27/301* (2013.01); *H01L 27/307* (2013.01)

(58) Field of Classification Search
CPC .... H01L 51/002; H01L 51/4273; H01L 51/44
See application file for complete search history.

(56) References Cited

U.S. PATENT DOCUMENTS

| 2005/0142384 A1 | 6/2005 | Itai |
| 2008/0035965 A1 | 2/2008 | Hayashi et al. |

(Continued)

FOREIGN PATENT DOCUMENTS

| CN | 1682572 A | 10/2005 |
| CN | 203466162 U | 3/2014 |

(Continued)

OTHER PUBLICATIONS

International Search Report and Written Opinion of PCT Application No. PCT/JP2017/009666, dated May 30, 2017,12 pages of ISRWO.

*Primary Examiner* — Cuong Q Nguyen
*Assistant Examiner* — Peter M Albrecht
(74) *Attorney, Agent, or Firm* — Chip Law Group

(57) ABSTRACT

The present technology relates to a photoelectric conversion element, a measuring method of the same, a solid-state imaging device, an electronic device, and a solar cell capable of further improving a quantum efficiency in a photoelectric conversion element using a photoelectric conversion layer including an organic semiconductor material. The photoelectric conversion element includes two electrodes forming a positive electrode (11) and a negative electrode (14), at least one charge blocking layer (13, 15) arranged between the two electrodes, and a photoelectric conversion layer (12) arranged between the two electrodes. The at least one charge blocking layer is an electron blocking layer (13) or a hole blocking layer (15), and a potential of the charge blocking layer is bent. The present technology is applied to, for example, a solid-state imaging device, a (Continued)

solar cell, and the like having a photoelectric conversion element.

4 Claims, 18 Drawing Sheets

(56) References Cited

U.S. PATENT DOCUMENTS

| | | |
|---|---|---|
| 2013/0180844 A1 | 7/2013 | Barnard |
| 2014/0217284 A1 | 8/2014 | So et al. |
| 2014/0239156 A1 | 8/2014 | Hayashi et al. |
| 2017/0054089 A1 | 2/2017 | Obana et al. |

FOREIGN PATENT DOCUMENTS

| | | |
|---|---|---|
| CN | 103733355 A | 4/2014 |
| EP | 1610594 A1 | 12/2005 |
| GB | 2484488 A | 4/2012 |
| JP | 2004-165516 A | 6/2004 |
| JP | 2007-088033 A | 4/2007 |
| JP | 2008-72090 A | 3/2008 |
| JP | 2008-072090 A | 3/2008 |
| JP | 2010-135496 A | 6/2010 |
| JP | 2012-19235 A | 1/2012 |
| JP | 2013-541165 A | 11/2013 |
| JP | 5488595 B2 | 5/2014 |
| JP | 2014-521214 A | 8/2014 |
| JP | 2015-233117 A | 12/2015 |
| KR | 10-2014-0064767 A | 5/2014 |
| WO | 2004/091262 A1 | 10/2004 |
| WO | 2010/134432 A1 | 11/2010 |
| WO | 2012/049110 A2 | 4/2012 |
| WO | 2013/003850 A2 | 1/2013 |
| WO | 2015/174010 A1 | 11/2015 |

PHOTOELECTRIC CONVERSION ELEMENT, MEASURING METHOD OF THE SAME, SOLID-STATE IMAGING DEVICE, ELECTRONIC DEVICE, AND SOLAR CELL

CROSS REFERENCE TO RELATED APPLICATIONS

This application is a U.S. National Phase of International Patent Application No. PCT/JP2017/009666 filed on Mar. 10, 2017, which claims priority benefit of Japanese Patent Application No. JP 2016-059977 filed in the Japan Patent Office on Mar. 24, 2016. Each of the above-referenced applications is hereby incorporated herein by reference in its entirety.

TECHNICAL FIELD

The present technology relates to a photoelectric conversion element, a measuring method of the same, a solid-state imaging device, an electronic device, and a solar cell, and more particularly, to a photoelectric conversion element, a measuring method of the same, a solid-state imaging device, an electronic device, and a solar cell capable of improving a quantum efficiency in a photoelectric conversion element using a photoelectric conversion layer of an organic semiconductor material.

BACKGROUND ART

In recent years, a solar cell, a solid-state imaging device, and the like using a photoelectric conversion layer including an organic semiconductor material as a photoelectric conversion element have been developed. The general structure of the photoelectric conversion element includes the photoelectric conversion layer and electrodes vertically sandwiching the photoelectric conversion layer therebetween. Regarding the photoelectric conversion element, further improvement in a photoelectric conversion efficiency has been desired. Furthermore, when being used to apply a voltage to the photoelectric conversion element, it has been desired to improve a response speed and to prevent a dark current.

In response to such a demand, for example, in Patent Documents 1 to 3, a method of using a charge blocking layer for the photoelectric conversion element has been proposed. The charge blocking layer not only functions to reduce charges injected from an electrode when a bias voltage is applied in the photoelectric conversion element but also serves as a charge transporting layer for promoting extraction of the photoelectrically converted charges to the electrode. Note that, in a case where the charge blocking layer has latter characteristics, the charge blocking layer may be referred to as a charge transporting layer. However, in both cases, the layer is described as a charge blocking layer herein.

In Patent Document 1, as a material used for an organic hole blocking layer, a material has been proposed that has an ionization potential Ip larger than a work function WF of a material of an adjacent electrode by equal to or more than 1.3 eV and has an electron affinity Ea equal to or larger than an electron affinity Ea of an adjacent organic photoelectric conversion layer. Furthermore, as a material used for an organic electron blocking layer, a material has been proposed that has an electron affinity Ea smaller than the work function WF of the material of the adjacent electrode by equal to or more than 1.3 eV and has an ionization potential Ip equal to or smaller than an ionization potential Ip of the material of the adjacent organic photoelectric conversion layer. Accordingly, Patent Document 1 discloses improvement in the response speed without decreasing an S/N ratio when an external voltage is applied.

Patent Document 2 has proposed a solar cell having a hole blocking layer having an ionization potential Ip larger than that of the photoelectric conversion layer by more than 0.1 to 2.0 eV.

Furthermore, in Patent Document 3, a photoelectric conversion element, in which a hole blocking layer, a photoelectric conversion layer, and an electron blocking layer are laminated in this order and levels of conductors and valence bands of the hole blocking layer, the photoelectric conversion layer, and the electron blocking layer get smaller in this order.

CITATION LIST

Patent Document

Patent Document 1: Japanese Patent Application Laid-Open No. 2007-088033
Patent Document 2: Japanese Patent Application Laid-Open No. 2004-165516
Patent Document 3: Japanese Patent Application Laid-Open No. 2010-135496

SUMMARY OF THE INVENTION

Problems to be Solved by the Invention

In a photoelectric conversion element using a photoelectric conversion layer of an organic semiconductor material, excitons generated in the photoelectric conversion layer are dissociated and electrons and holes are collected by respective electrodes to obtain a quantum efficiency. With the structures proposed in Patent Documents 1 to 3, it has been concerned that an increase in a film thickness as the photoelectric conversion element by laminating the charge blocking layers weakens an electric field to be applied to the photoelectric conversion layer and reduces a quantum efficiency at the time of application of the bias voltage than a case where the same bias voltage is applied to a photoelectric conversion element with no charge blocking layer.

The present technology has been made in view of such a situation. The present technology further improves a quantum efficiency in a photoelectric conversion element using a photoelectric conversion layer of an organic semiconductor material.

Solutions to Problems

A photoelectric conversion element according to a first aspect of the present technology includes two electrodes forming a positive electrode and a negative electrode, at least one charge blocking layer arranged between the two electrodes, and a photoelectric conversion layer arranged between the two electrodes, in which
when the at least one charge blocking layer is an electron blocking layer,
positions X1, X2, and X3 are located at predetermined distances x1, x2, and x3 (x1<x2<x3) from an interface between the electron blocking layer and the negative electrode toward the photoelectric conversion layer, and absolute values $\Delta E(X1)$, $\Delta E(X2)$, and $\Delta E(X3)$ of a difference between an electron affinity Ea of the electron blocking layer and a work function WF of the negative electrode at each position satisfy a following formula (1), $$\Delta E(X2) > \Delta E(X1) \text{ and } \Delta E(X2) > \Delta E(X3) \tag{1},$$

and when the at least one charge blocking layer is a hole blocking layer, positions X1', X2', and X3' are located at predetermined distances x1', x2', and x3' (x1'<x2'<x3') from an interface between the hole blocking layer and the positive electrode toward the photoelectric conversion layer, and absolute values $\Delta E(X1')$, $\Delta E(X2')$, and $\Delta E(X3')$ of a difference between a work function WF of the positive electrode and an ionization potential Ip at each position satisfy a following formula (2), $$\Delta E(X2') > \Delta E(X1') \text{ and } \Delta E(X2') > \Delta E(X3') \tag{2}$$

A measuring method of a photoelectric conversion element according to a second aspect of the present technology, the method including:

performing photoelectron spectrometry or inverse photoelectron spectrometry on an exposed surface while irradiating at least one charge blocking layer of a photoelectric conversion element with a gas cluster ion beam, the photoelectric conversion element including:

two electrodes forming a positive electrode and a negative electrode;

at least one charge blocking layer arranged between the two electrodes; and a photoelectric conversion layer arranged between the two electrodes, in which it is confirmed that when the at least one charge blocking layer is an electron blocking layer, positions X1, X2, and X3 are located at predetermined distances x1, x2, and x3 (x1<x2<x3) from an interface between the electron blocking layer and the negative electrode toward the photoelectric conversion layer, and absolute values $\Delta E(X1)$, $\Delta E(X2)$, and $\Delta E(X3)$ of a difference between an electron affinity Ea of the electron blocking layer and a work function WF of the negative electrode at each position satisfy a following formula (1), $$\Delta E(X2) > \Delta E(X1) \text{ and } \Delta E(X2) > \Delta E(X3) \tag{1},$$

and when the at least one charge blocking layer is a hole blocking layer, positions X1', X2', and X3' are located at predetermined distances x1', x2', and x3' (x1'<x2'<x3') from an interface between the hole blocking layer and the positive electrode toward the photoelectric conversion layer, and absolute values $\Delta E(X1')$, $\Delta E(X2')$, and $\Delta E(X3')$ of a difference between a work function WF of the positive electrode and an ionization potential Ip of the hole blocking layer at each position satisfy a following formula (2), $$\Delta E(X2') > \Delta E(X1') \text{ and } \Delta E(X2') > \Delta E(X3') \tag{2}$$

A solid-state imaging device according to third aspect of the present technology includes a photoelectric conversion element including:

two electrodes forming a positive electrode and a negative electrode, at least one charge blocking layer arranged between the two electrodes, and a photoelectric conversion layer arranged between the two electrodes, in which when the at least one charge blocking layer is an electron blocking layer, positions X1, X2, and X3 are located at predetermined distances x1, x2, and x3 (x1<x2<x3) from an interface between the electron blocking layer and the negative electrode toward the photoelectric conversion layer, and absolute values $\Delta E(X1)$, $\Delta E(X2)$, and $\Delta E(X3)$ of a difference between an electron affinity Ea of the electron blocking layer and a work function WF of the negative electrode at each position satisfy a following formula (1), $$\Delta E(X2) > \Delta E(X1) \text{ and } \Delta E(X2) > \Delta E(X3) \tag{1},$$

and when the at least one charge blocking layer is a hole blocking layer, positions X1', X2', and X3' are located at predetermined distances x1', x2', and x3' (x1'<x2'<x3') from an interface between the hole blocking layer and the positive electrode toward the photoelectric conversion layer, and absolute values $\Delta E(X1')$, $\Delta E(X2')$, and $\Delta E(X3')$ of a difference between a work function WF of the positive electrode and an ionization potential Ip of the hole blocking layer at each position satisfy a following formula (2), $$\Delta E(X2') > \Delta E(X1') \text{ and } \Delta E(X2') > \Delta E(X3') \tag{2}$$

An electronic device according to a fourth aspect of the present technology includes a solid-state imaging device including a photoelectric conversion element including:

two electrodes forming a positive electrode and a negative electrode, at least one charge blocking layer arranged between the two electrodes, and a photoelectric conversion layer arranged between the two electrodes, in which when the at least one charge blocking layer is an electron blocking layer, positions X1, X2, and X3 are located at predetermined distances x1, x2, and x3 (x1<x2<x3) from an interface between the electron blocking layer and the negative electrode toward the photoelectric conversion layer, and absolute values $\Delta E(X1)$, $\Delta E(X2)$, and $\Delta E(X3)$ of a difference between an electron affinity Ea of the electron blocking layer and a work function WF of the negative electrode at each position satisfy a following formula (1), $$\Delta E(X2) > \Delta E(X1) \text{ and } \Delta E(X2) > \Delta E(X3) \tag{1},$$

and when the at least one charge blocking layer is a hole blocking layer, positions X1', X2', and X3' are located at predetermined distances x1', x2', and x3' (x1'<x2'<x3') from an interface between the hole blocking layer and the positive electrode toward the photoelectric conversion layer, and absolute values $\Delta E(X1')$, $\Delta E(X2')$, and $\Delta E(X3')$ of a difference between a work function WF of the positive electrode and an ionization potential Ip of the hole blocking layer at each position satisfy a following formula (2), $$\Delta E(X2') > \Delta E(X1') \text{ and } \Delta E(X2') > \Delta E(X3') \tag{2}$$

A solar cell according to a fifth aspect of the present technology includes:

two electrodes forming a positive electrode and a negative electrode, at least one charge blocking layer arranged between the two electrodes, and a photoelectric conversion layer arranged between the two electrodes, in which when the at least one charge blocking layer is an electron blocking layer, positions X1, X2, and X3 are located at predetermined distances x1, x2, and x3 (x1<x2<x3) from an interface between the electron blocking layer and the negative electrode toward the photoelectric conversion layer, and absolute values ΔE(X1), ΔE(X2), and ΔE(X3) of a difference between an electron affinity Ea of the electron blocking layer and a work function WF of the negative electrode at each position satisfy a following formula (1), $$\Delta E(X2) > \Delta E(X1) \text{ and } \Delta E(X2) > \Delta E(X3) \tag{1}$$

and when the at least one charge blocking layer is a hole blocking layer, positions X1', X2', and X3' are located at predetermined distances x1', x2', and x3' (x1'<x2'<x3') from an interface between the hole blocking layer and the positive electrode toward the photoelectric conversion layer, and absolute values ΔE(X1'), ΔE(X2'), and ΔE(X3') of a difference between a work function WF of the positive electrode and an ionization potential Ip of the hole blocking layer at each position satisfy a following formula (2), $$\Delta E(X2') > \Delta E(X1') \text{ and } \Delta E(X2') > \Delta E(X3') \tag{2}$$

In the first to fifth aspects of the present technology, as a photoelectric conversion element,
   two electrodes forming a positive electrode and a negative electrode, at least one charge blocking layer arranged between the two electrodes, and a photoelectric conversion layer arranged between the two electrodes are provided, in which
   when the at least one charge blocking layer is an electron blocking layer,
   positions X1, X2, and X3 are located at predetermined distances x1, x2, and x3 (x1<x2<x3) from an interface between the electron blocking layer and the negative electrode toward the photoelectric conversion layer, and absolute values ΔE(X1), ΔE(X2), and ΔE(X3) of a difference between an electron affinity Ea of the electron blocking layer and a work function WF of the negative electrode at each position satisfy a following formula (1), $$\Delta E(X2) > \Delta E(X1) \text{ and } \Delta E(X2) > \Delta E(X3) \tag{1}$$

and when the at least one charge blocking layer is a hole blocking layer, positions X1', X2', and X3' are located at predetermined distances x1', x2', and x3' (x1'<x2'<x3') from an interface between the hole blocking layer and the positive electrode toward the photoelectric conversion layer, and absolute values ΔE(X1'), ΔE(X2'), and ΔE(X3') of a difference between a work function WF of the positive electrode and an ionization potential Ip of the hole blocking layer at each position satisfy a following formula (2), $$\Delta E(X2') > \Delta E(X1') \text{ and } \Delta E(X2') > \Delta E(X3') \tag{2}$$

The photoelectric conversion element, the solid-state imaging device, the electronic device, and the solar cell may be independent devices or may be modules incorporated in other devices.

Effects of the Invention

According to the first to fifth aspects of the present technology, in a photoelectric conversion element using a photoelectric conversion layer of an organic semiconductor material, a quantum efficiency can be further improved.

Note that the effects described herein are not necessarily limited and may be any of the effects described in the present disclosure.

MODE FOR CARRYING OUT THE INVENTION

Hereinafter, modes (hereinafter referred to as embodiments) for implementing present technology will be described. Note that the description will be made in the following order.
1. First Embodiment of Photoelectric Conversion Element (Exemplary Configuration Including Electron Blocking Layer)
2. Second Embodiment of Photoelectric Conversion Element (Exemplary Configuration Including Hole Blocking Layer)
3. Third Embodiment of Photoelectric Conversion Element (Exemplary Configuration Including Electron Blocking Layer and Hole Blocking Layer)
4. Fourth Embodiment of Photoelectric Conversion Element (Exemplary Configuration Including Two Hole Blocking Layers)
5. Fifth Embodiment of Photoelectric Conversion Element (Exemplary Configuration Including Two Electron Blocking Layers)
6. Sixth Embodiment of Photoelectric Conversion Element (Exemplary Configuration Example Including Three Electron Blocking Layers)
7. Seventh Embodiment of Photoelectric Conversion Element (Exemplary Configuration Including Three Hole Blocking Layers)
8. Summary of Embodiments
9. Method of Confirming Band Bending
10. Embodiment of Solid-State Imaging Device
11. Method of Manufacturing Photoelectric Conversion Element
12. Example of Application to Electronic Device 1. First Embodiment of Photoelectric Conversion Element FIG. 1 illustrates a cross-sectional structure of a photoelectric conversion element 1A as a first embodiment of a photoelectric conversion element 1 to which the present technology is applied.

Figure 1:
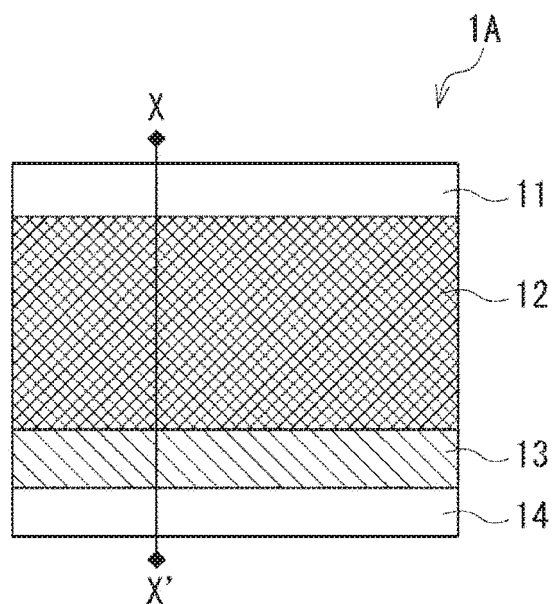
FIG. 1 is a cross-sectional structural diagram of a first embodiment of a photoelectric conversion element to which the present technology is applied.

The photoelectric conversion element 1A in FIG. 1 has a laminated structure including an upper electrode 11, a photoelectric conversion layer 12, an electron blocking layer 13, and a lower electrode 14.

In the photoelectric conversion layer 12, electrons and holes obtained by photoelectrically converting incident light are collected by the upper electrode 11 or the lower electrode 14. In FIG. 1, a bias voltage is applied so that a potential of the lower electrode 14 is higher than a potential of the upper electrode 11. In this case, the upper electrode 11 is a positive electrode, and the lower electrode 14 is a negative electrode.

Photoelectrically converted electrons are collected by the upper electrode 11 that is a positive electrode, and holes are collected by the lower electrode 14 that is a negative electrode.

The upper electrode 11 and the lower electrode 14 includes, for example, an indium tin oxide (ITO) film, an indium zinc oxide film, and the like.

The photoelectric conversion layer 12 is a film that photoelectrically converts the absorbed light, and is a layer in which an electron donating material and an electron accepting material are mixed. The photoelectric conversion layer 12 is formed by, for example, a vapor deposition and solution process.

The electron donating material and the electron accepting material are photoelectric conversion materials and in which light is absorbed and a carrier is transferred. The electron donating material is referred to as an electron donating compound, an electron donor, an N-type material, and the like. The electron accepting material is referred to as an electron accepting compound, an electron acceptor, a P-type material, and the like.

For example, the electron donating material is an amine compound represented by N,N'-Bis(3-tolyl)-N, N'-diphenylbenzene (mTPD), N,N'-dinaphthyl-N,N'-diphenylbenzidine (NPD), 4,4',4"-tris(phenyl-3-tolylamino)triphenylamine (MTDATA), and the like and phthalocyanines such as phthalocyanine (Pc), copper phthalocyanine (CuPc), zinc phthalocyanine (ZnPc), and titanyl phthalocyanine (TiOPc), and porphyrins represented by octaethylporphyrin (OEP), platinum octaethylporphyrin (PtOEP), zinc tetraphenylporphyrin (ZNTPP), and the like. Furthermore, as a macromolecular compound using a coating process with a solution, a main chain type conjugate polymer such as methoxyethylhexyloxyphenylenevinylene (MEHPPV), polyhexylthiophene (P3HT), and cyclopentadithiophene-benzothiadiazole (PCPDTBT), a side chain type polymer such as polyvinyl carbazole, and the like can be exemplified.

As an electron accepting material, for example, organic compounds such as a fullerene derivative such as C60 and C70, a carbon nanotube, a perylene derivative, a polycyclic quinone, and a quinacridone and polymers such as CN-poly (phenylene-vinylene), MEH-CN-PPV, a polymer containing —CN group or CF3 group, and a poly (fluorene) derivative can be exemplified. Note that a material with a small electron affinity Ea is preferred. By combining materials having a small electron affinity Ea as an N layer, a sufficient open end voltage can be realized.

The electron blocking layer 13 functions to promote the transfer of the holes photoelectrically converted by the photoelectric conversion layer 12 to the lower electrode (negative electrode) 14 and to block the photoelectrically converted electrons so as not to reach the lower electrode (negative electrode) 14. Furthermore, when being used to apply the bias voltage, the electron blocking layer 13 has a function to prevent injection of electrons from the lower electrode (negative electrode) 14, in addition to the above functions.

As a material of the electron blocking layer 13, an electron blocking material indicating band bending is used. As the electron blocking material indicating the band bending, for example, TAPC, TCTA, HATCN, and the like can be used. Note that the electron blocking material indicting the band bending is not limited to these.

Note that as a method of confirming the band bending of the electron blocking layer 13, a method of repeating surface potential measurement and film formation by the Kelvin method described in "Applied Physics Vol. 71 (2002) No. 12, p. 1488" and a method of repeating sputtering and X-ray photoelectron spectroscopy described in "JOURNAL OF APPLIED PHYSICS (2013), vol. 114, p. 013703" can be employed, for example. Of course, the method of measuring the band bending is not limited to this.

Figure 2:
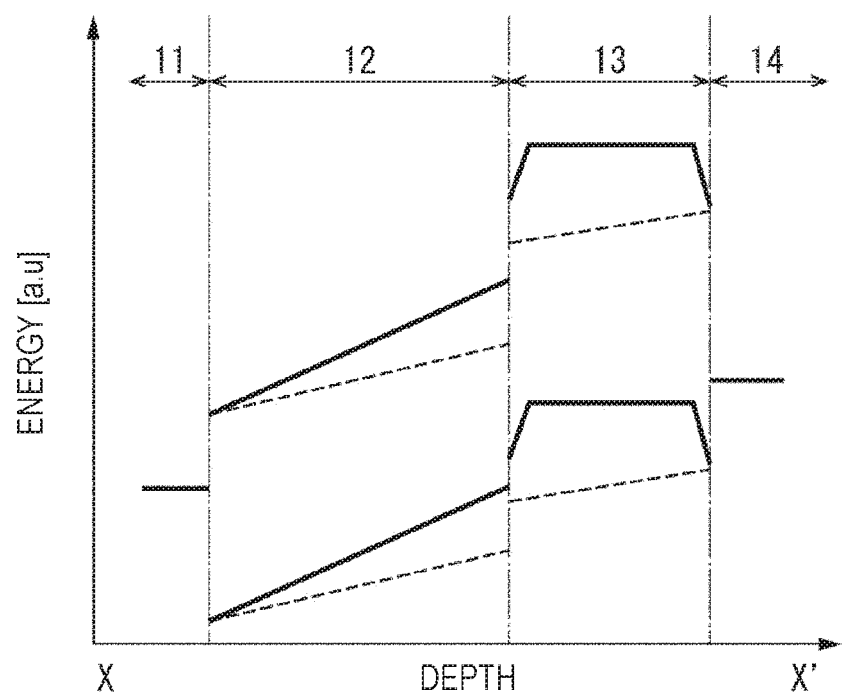
FIG. 2 is a chart of an energy diagram of the photoelectric conversion element in FIG. 1.

FIG. 2 illustrates an energy diagram of the photoelectric conversion element 1A taken long a line X-X' in FIG. 1.

An energy profile indicated by a solid line in FIG. 2 indicates an energy profile of the photoelectric conversion element 1A. On the other hand, for comparison, an energy profile indicated by a broken line in FIG. 2 indicates an energy profile in a case where a part of the electron blocking layer 13 includes a material having an ionization potential Ip and the electron affinity Ea same as those of the electron blocking layer 13 and a material to which an electric field is uniformly applied (no band bending).

As illustrated in FIG. 2, regarding the energy profile of the photoelectric conversion element 1A including the electron blocking layer 13 using a material with band bending, a potential of the photoelectric conversion layer 12 becomes steep, and the electric field is strongly applied. Therefore, a quantum efficiency is improved. Furthermore, a difference between a work function WF of the lower electrode (negative electrode) 14 and the minimum value of the electron affinity Ea of the electron blocking layer 13 increases. As a result, electron injection from the lower electrode (negative electrode) 14 can be prevented, and a dark current to be a noise can be reduced.

2. Second Embodiment of Photoelectric Conversion Element

Figure 3:
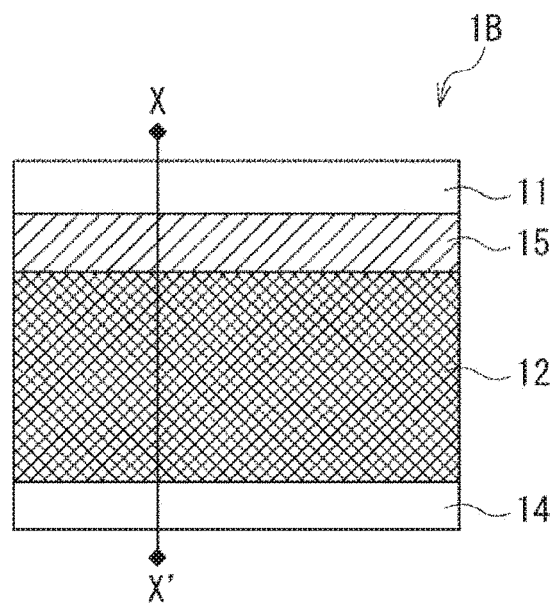
FIG. 3 is a cross-sectional structural diagram of a second embodiment of the photoelectric conversion element to which the present technology is applied.

FIG. 3 illustrates a cross-sectional structure of a photoelectric conversion element 1B as a second embodiment of the photoelectric conversion element 1 to which the present technology is applied.

In FIG. 3, components corresponding to those of the first embodiment are denoted with the same reference numerals, and the description thereof will be omitted.

The photoelectric conversion element 1B in FIG. 3 has a laminated structure including an upper electrode 11, a hole blocking layer 15, a photoelectric conversion layer 12, and a lower electrode 14.

In other words, in the second embodiment, the upper electrode 11, the photoelectric conversion layer 12, and the lower electrode 14 are similar to those in the first embodiment. Then, in the second embodiment, the electron blocking layer 13 in the first embodiment is omitted, and instead of the electron blocking layer 13, the hole blocking layer 15 is provided between the upper electrode 11 and the photoelectric conversion layer 12. In FIG. 3, a bias voltage is applied so that a potential of the lower electrode 14 is higher than a potential of the upper electrode 11. The upper electrode 11 is a positive electrode, and the lower electrode 14 is a negative electrode.

The hole blocking layer 15 is a charge blocking layer that functions to promote transfer of electrons photoelectrically converted by the photoelectric conversion layer 12 to the upper electrode (positive electrode) 11 and to block photoelectrically converted holes so as not to reach the upper electrode (positive electrode) 11. Furthermore, when being used to apply the bias voltage, the hole blocking layer 15 has a function to prevent injection of the holes from the upper electrode (positive electrode) 11, in addition to the above functions.

As a material of the hole blocking layer 15, a hole blocking material indicating band bending is used. As the hole blocking material indicating the band bending, for example, B2PyMPM, B3PyMPM, B3PyPB, B3PyPPM, B4PyMPM, a B4PyMPM dielectric, B4PyPB, a HATNA dielectric, and the like can be used. Note that the hole blocking material indicating the band bending is not limited to these.

Figure 4:
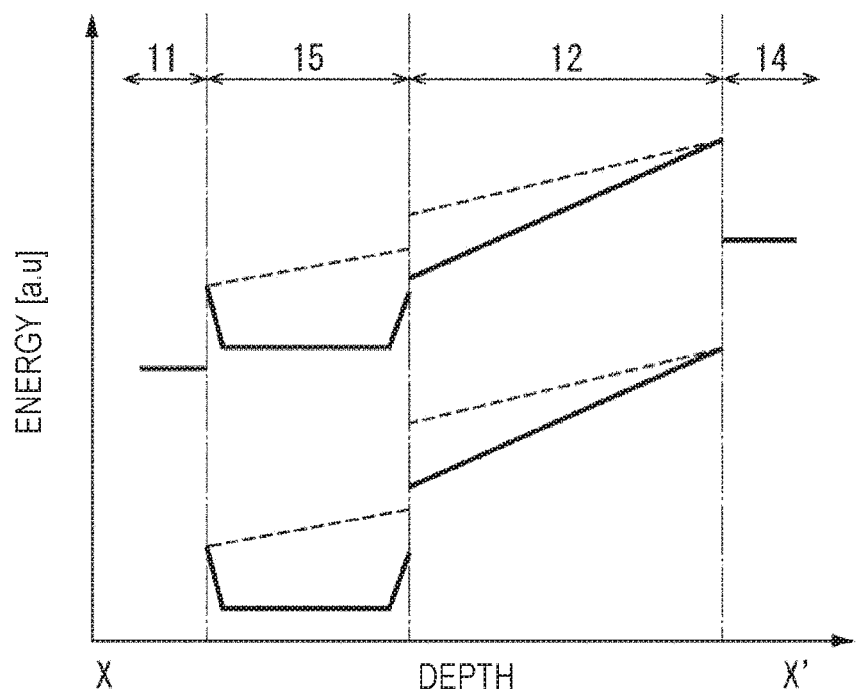
FIG. 4 is a chart of an energy diagram of the photoelectric conversion element in FIG. 3.

FIG. 4 illustrates an energy diagram of the photoelectric conversion element 1B taken along a line X-X' in FIG. 3.

An energy profile indicated by a solid line in FIG. 4 indicates an energy profile of the photoelectric conversion element 1B. On the other hand, for comparison, an energy profile indicated by a broken line in FIG. 4 indicates an energy profile in a case where a part of the hole blocking layer 15 includes a material having an ionization potential Ip and the electron affinity Ea same as those of the hole blocking layer 15 and a material to which an electric field is uniformly applied (no band bending).

As illustrated in FIG. 4, regarding the energy profile of the photoelectric conversion element 1B including the hole blocking layer 15 using a material with band bending, a potential of the photoelectric conversion layer 12 becomes steep, and the electric field is strongly applied. Therefore, a quantum efficiency is improved. Furthermore, a difference between a work function WF of the upper electrode (positive electrode) 11 and the maximum value of an ionization potential Ip of the hole blocking layer 15 increases. As a result, hole injection from the upper electrode (positive electrode) 11 can be prevented, and a dark current to be a noise can be reduced.

3. Third Embodiment of Photoelectric Conversion Element

Figure 5:
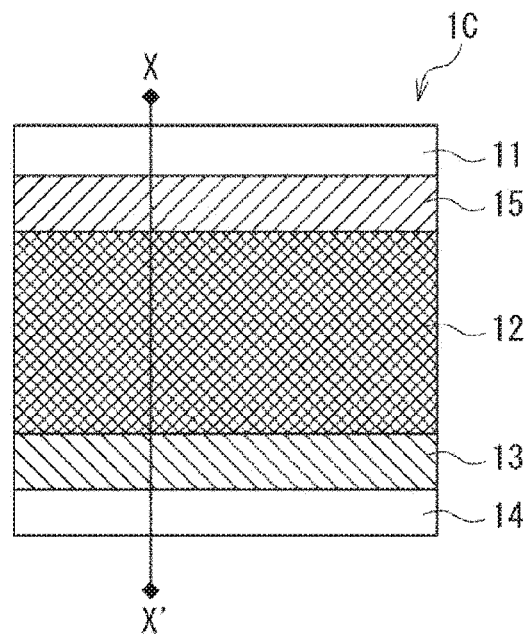
FIG. 5 is a cross-sectional structural diagram of a third embodiment of the photoelectric conversion element to which the present technology is applied.

FIG. 5 illustrates a cross-sectional structure of a photoelectric conversion element 1C as a third embodiment of the photoelectric conversion element 1 to which the present technology is applied.

In the third embodiment, description of components denoted with the same reference numerals as those in the first and second embodiments will be appropriately omitted.

The photoelectric conversion element 1C in FIG. 5 has a laminated structure including an upper electrode 11, a hole blocking layer 15, a photoelectric conversion layer 12, an electron blocking layer 13, and a lower electrode 14. In other words, the photoelectric conversion element 1C according to the third embodiment includes the electron blocking layer 13 between the photoelectric conversion layer 12 and the lower electrode 14 of the photoelectric conversion element 1A according to the first embodiment and the hole blocking layer 15 between the upper electrode 11 and the photoelectric conversion layer 12 of the photoelectric conversion element 1B according to the second embodiment.

Figure 6:
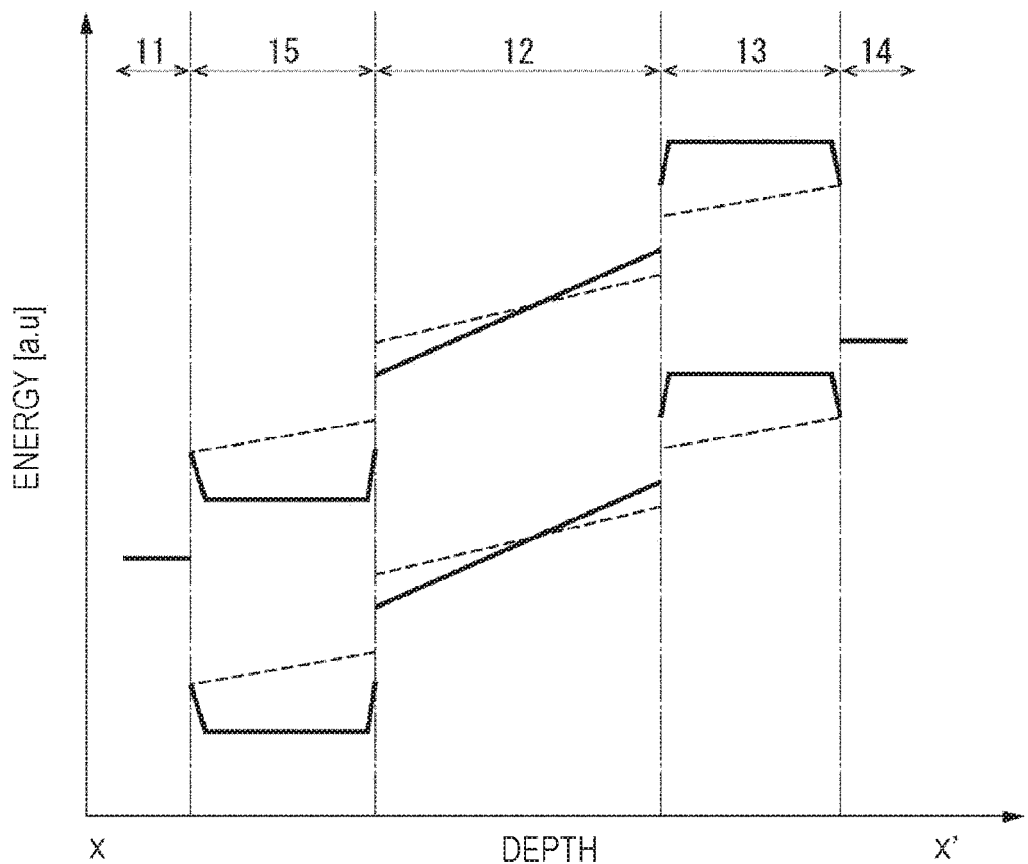
FIG. 6 is a chart of an energy diagram of the photoelectric conversion element in FIG. 5.

FIG. 6 illustrates an energy diagram of the photoelectric conversion element 1C taken long a line X-X' in FIG. 5.

An energy profile indicated by a solid line in FIG. 6 indicates an energy profile of the photoelectric conversion element 1C. On the other hand, for comparison, an energy profile indicated by a broken line in FIG. 6 indicates an energy profile in a case where a part of the electron blocking layer 13 and the hole blocking layer 15 includes a material having an ionization potential Ip and the electron affinity Ea same as those of the electron blocking layer 13 and the hole blocking layer 15 and a material to which an electric field is uniformly applied (no band bending).

As illustrated in FIG. 6, regarding the energy profile of the photoelectric conversion element 1C including the electron blocking layer 13 and the hole blocking layer 15 using materials with band bending, a potential of the photoelectric conversion layer 12 becomes steep, and the electric field is strongly applied. Therefore, a quantum efficiency is improved.

Furthermore, a difference between a work function WF of the lower electrode (negative electrode) 14 and the minimum value of the electron affinity Ea of the electron blocking layer 13 increases. As a result, electron injection from the lower electrode (negative electrode) 14 can be prevented, and a dark current to be a noise can be reduced.

Furthermore, a difference between a work function WF of the upper electrode (positive electrode) 11 and the maximum value of an ionization potential Ip of the hole blocking layer 15 increases. As a result, hole injection from the upper electrode (positive electrode) 11 can be prevented, and a dark current to be a noise can be reduced.

Accordingly, the photoelectric conversion element 1C according to the third embodiment includes both characteristics of the first and second embodiments so that charge injection from both of the upper electrode (positive electrode) 11 and the lower electrode (negative electrode) 14 can be prevented, and a dark current can be further reduced.

4. Fourth Embodiment of Photoelectric Conversion Element

Figure 7:
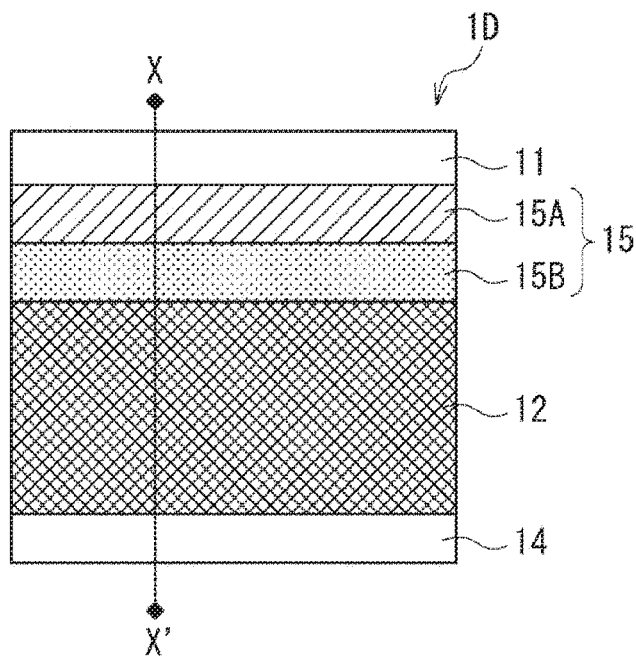
FIG. 7 is a cross-sectional structural diagram of a fourth embodiment of the photoelectric conversion element to which the present technology is applied.

FIG. 7 illustrates a cross-sectional structure of a photoelectric conversion element 1D as a fourth embodiment of the photoelectric conversion element 1 to which the present technology is applied.

In the fourth embodiment, description of components denoted with the same reference numerals as those in the first to third embodiments will be appropriately omitted.

The photoelectric conversion element 1D in FIG. 7 is common to the photoelectric conversion element 1B according to the second embodiment illustrated in FIG. 3 in that the photoelectric conversion element 1D has a laminated structure including an upper electrode 11, a hole blocking layer 15, a photoelectric conversion layer 12, and a lower electrode 14.

On the other hand, the photoelectric conversion element 1D is different from the photoelectric conversion element 1B according to the second embodiment in that the hole blocking layer 15 includes two layers, i.e., a first hole blocking layer 15A and a second hole blocking layer 15B having different donor impurity densities.

A donor impurity density of the first hole blocking layer 15A is equal to or higher than 1e16/cm3 (=$1.0\times10^{16}$/cm3), and a donor impurity density of the second hole blocking layer 15 is lower than 1e16/cm3. The donor impurity density of the first hole blocking layer 15A is preferably equal to or higher than 1e17/cm3 and is more preferably equal to or higher than 1e18/cm3. As an impurity to be doped as a donor, an organic substance such as Ru(terpy)2, an inorganic substance such as Cs2CO3, alkali metal such as Li, and the like can be considered as a material. Note that the material to be doped is not limited these.

Figure 8:
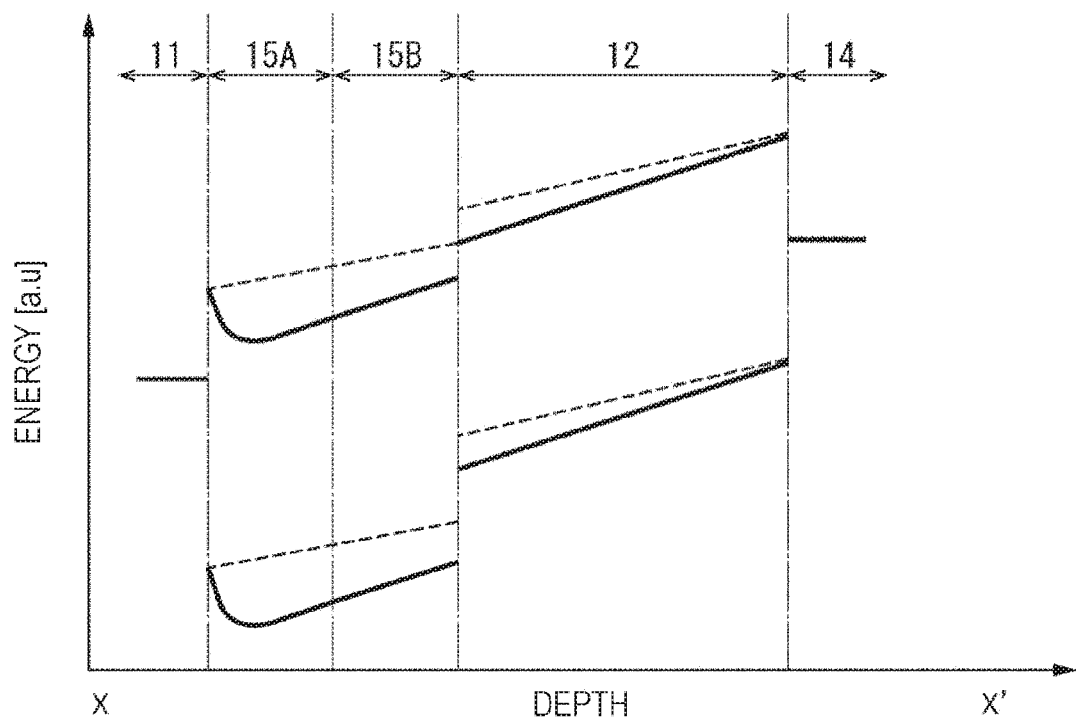
FIG. 8 is a chart of an energy diagram of the photoelectric conversion element in FIG. 7.

FIG. 8 illustrates an energy diagram of the photoelectric conversion element 1D taken long a line X-X' in FIG. 7.

An energy profile indicated by a solid line in FIG. 8 indicates an energy profile of the photoelectric conversion element 1D. On the other hand, for comparison, an energy profile indicated by a broken line in FIG. 8 indicates an energy profile in a case where a part of the hole blocking layer 15 includes a material having an ionization potential Ip and the electron affinity Ea same as those of the hole blocking layer 15 and a material to which an electric field is uniformly applied (no band bending).

As illustrated in FIG. 8, since a donor impurity density of the first hole blocking layer 15A is high, a band is bent. As a result, regarding the energy profile of the photoelectric conversion element 1D, a potential of the photoelectric conversion layer 12 becomes steep, and an electric field is strongly applied. Therefore, a quantum efficiency is improved. Furthermore, a difference between a work function WF of the upper electrode (positive electrode) 11 and the maximum value of an ionization potential Ip of the hole blocking layer 15 increases. As a result, hole injection from the upper electrode (positive electrode) 11 can be prevented, and a dark current to be a noise can be reduced.

Note that an order of lamination of the first hole blocking layer 15A and the second hole blocking layer 15B may be reversed. In other words, in FIG. 7, a lamination is made in which the first hole blocking layer 15A having a high donor impurity density has contact with the upper electrode (positive electrode) 11 and the second hole blocking layer 15B having a low donor impurity density has contact with the photoelectric conversion layer 12. However, the lamination may be made in which the first hole blocking layer 15A has contact with the photoelectric conversion layer 12 and the second hole blocking layer 15B has contact with the upper electrode (positive electrode) 11.

Figure 9:
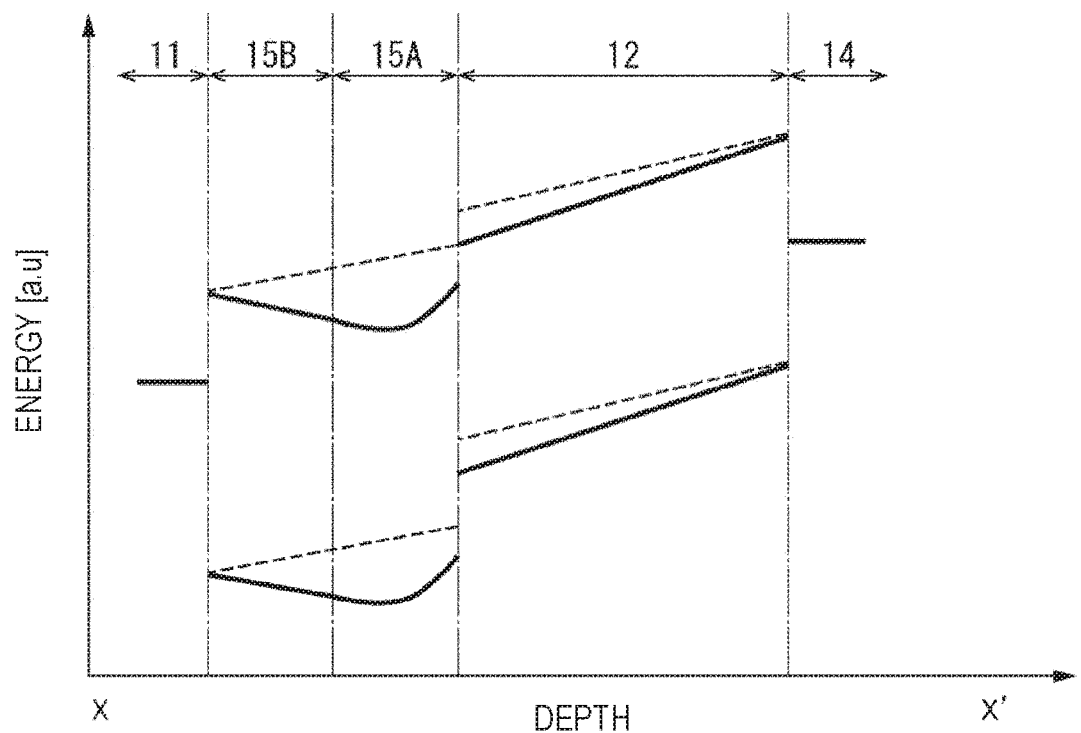
FIG. 9 is a chart of an energy diagram of a photoelectric conversion element in which two hole blocking layers in FIG. 7 are replaced.

FIG. 9 illustrates an energy diagram in a case where an order of the lamination of the first hole blocking layer 15A and the second hole blocking layer 15B is reversed to that in FIG. 7.

Even in this case, since the donor impurity density of the first hole blocking layer 15A is high, the band is bent. As a result, regarding the energy profile of the photoelectric conversion element 1D, a potential of the photoelectric conversion layer 12 becomes steep, and an electric field is strongly applied. Therefore, a quantum efficiency is improved. Furthermore, a difference between a work function WF of the upper electrode (positive electrode) 11 and the maximum value of an ionization potential Ip of the hole blocking layer 15 increases. As a result, hole injection from the upper electrode (positive electrode) 11 can be prevented, and a dark current to be a noise can be reduced.

5. Fifth Embodiment of Photoelectric Conversion Element

Figure 10:
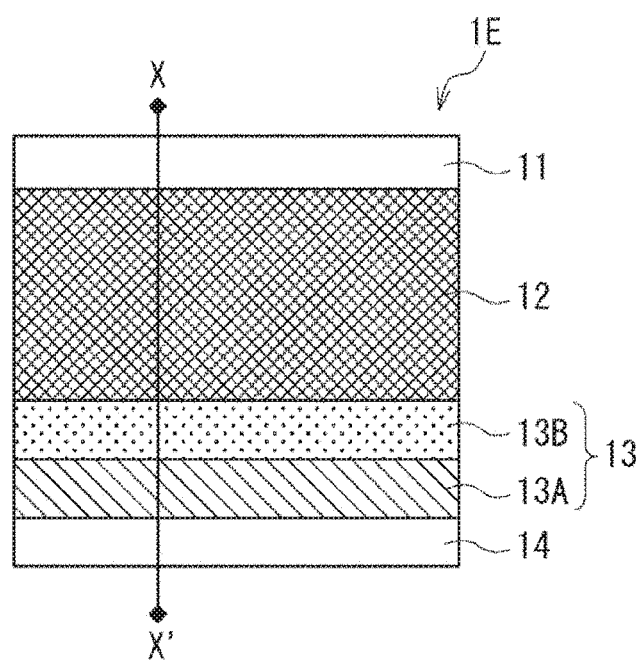
FIG. 10 is a cross-sectional structural diagram of a fifth embodiment of the photoelectric conversion element to which the present technology is applied.

FIG. 10 illustrates a cross-sectional structure of a photoelectric conversion element 1E as a fifth embodiment of the photoelectric conversion element 1 to which the present technology is applied.

In the fifth embodiment, description of components denoted with the same reference numerals as those in the first to fourth embodiments will be appropriately omitted.

The photoelectric conversion element 1E in FIG. 10 is common to the photoelectric conversion element 1A according to the first embodiment illustrated in FIG. 1 in that the photoelectric conversion element 1E has a laminated structure including an upper electrode 11, a photoelectric conversion layer 12, an electron blocking layer 13, and a lower electrode 14.

On the other hand, the photoelectric conversion element 1E is different from the photoelectric conversion element 1A according to the first embodiment in that the electron blocking layer 13 includes two layers, i.e., a first electron blocking layer 13A and a second electron blocking layer 13B having different acceptor impurity densities.

An acceptor impurity density of the first electron blocking layer 13A is equal to or higher than 1e16/cm3, and an acceptor impurity density of the second electron blocking layer 13B is lower than 1e16/cm3. The acceptor impurity density of the first electron blocking layer 13A is preferably equal to or higher than 1e17/cm3 and is more preferably equal to or higher than 1e18/cm3. As an impurity to be doped as an acceptor, an organic substance such as F4-TCNQ and dibenzo 18-crown-6 ether (DBC) and an inorganic substance material such as MoO3 and V2O5 can be considered. Note that the material to be doped is not limited these.

Figure 11:
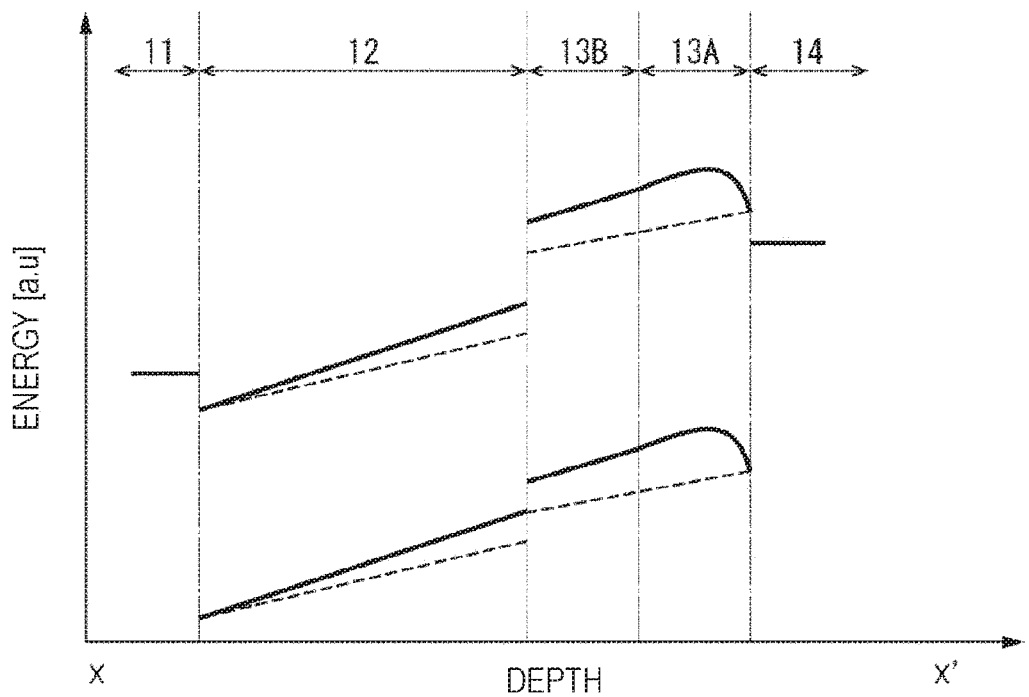
FIG. 11 is a chart of an energy diagram of the photoelectric conversion element in FIG. 10.

FIG. 11 illustrates an energy diagram of the photoelectric conversion element 1E taken long a line X-X' in FIG. 10.

An energy profile indicated by a solid line in FIG. 11 indicates an energy profile of the photoelectric conversion element 1E. On the other hand, for comparison, an energy profile indicated by a broken line in FIG. 11 indicates an energy profile in a case where a part of the electron blocking layer 13 includes a material having an ionization potential Ip and the electron affinity Ea same as those of the electron blocking layer 13 and a material to which an electric field is uniformly applied (no band bending).

As illustrated in FIG. 11, since the acceptor impurity density of the first electron blocking layer 13A is high, a band is bent. As a result, regarding the energy profile of the photoelectric conversion element 1E, a potential of the photoelectric conversion layer 12 becomes steep, and an electric field is strongly applied. Therefore, a quantum efficiency is improved. Furthermore, a difference between a work function WF of the lower electrode (negative electrode) 14 and the minimum value of the electron affinity Ea of the electron blocking layer 13 increases. As a result, electron injection from the lower electrode (negative electrode) 14 can be prevented, and a dark current to be a noise can be reduced.

Note that an order of lamination of the first electron blocking layer 13A and the second electron blocking layer 13B may be reversed. In other words, in FIG. 10, a lamination is made in which the first electron blocking layer 13A having a high acceptor impurity density has contact with the lower electrode (negative electrode) 14 and the second electron blocking layer 13B having a lower electrode acceptor impurity density has contact with the photoelectric conversion layer 12. However, the lamination may be made in which the first electron blocking layer 13A has contact with the photoelectric conversion layer 12 and the second electron blocking layer 13B has contact with the lower electrode (negative electrode) 14.

Figure 12:
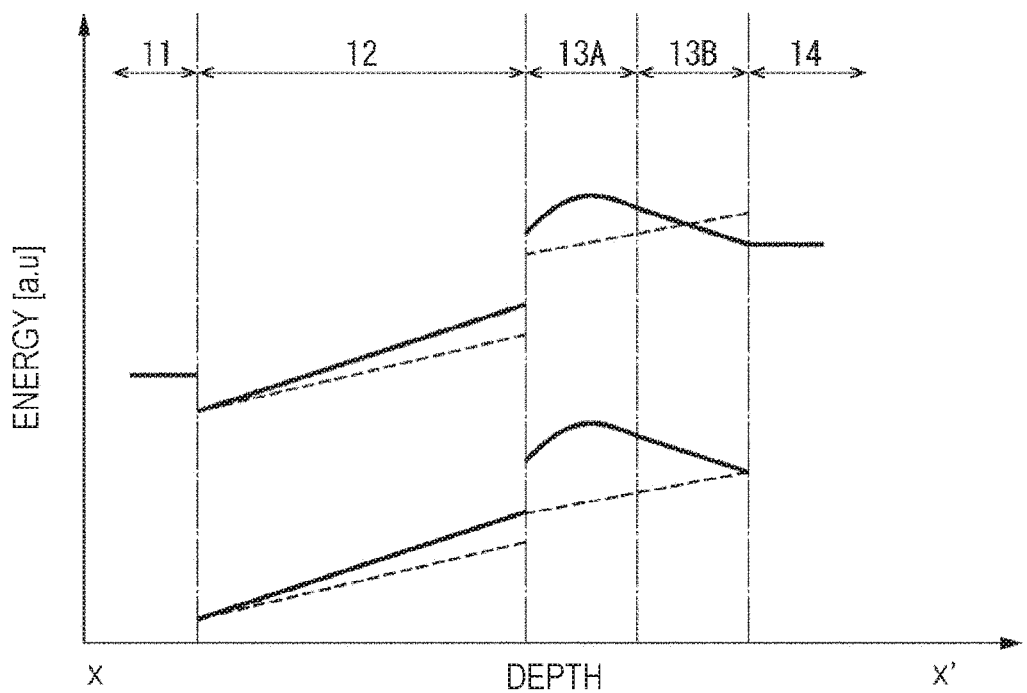
FIG. 12 is a chart of an energy diagram of a photoelectric conversion element in which two electron blocking layers in FIG. 10 are replaced.

FIG. 12 illustrates an energy diagram in a case where an order of the lamination of the first electron blocking layer 13A and the second electron blocking layer 13B is reversed from that in FIG. 10.

Even in this case, since the acceptor impurity density of the first electron blocking layer 13A is high, the band is bent. As a result, regarding the energy profile of the photoelectric conversion element 1E, a potential of the photoelectric conversion layer 12 becomes steep, and an electric field is strongly applied. Therefore, a quantum efficiency is improved. Furthermore, a difference between a work function WF of the lower electrode (negative electrode) 14 and the minimum value of the electron affinity Ea of the electron blocking layer 13 increases. As a result, electron injection from the lower electrode (negative electrode) 14 can be prevented, and a dark current to be a noise can be reduced.

6. Sixth Embodiment of Photoelectric Conversion Element

Figure 13:
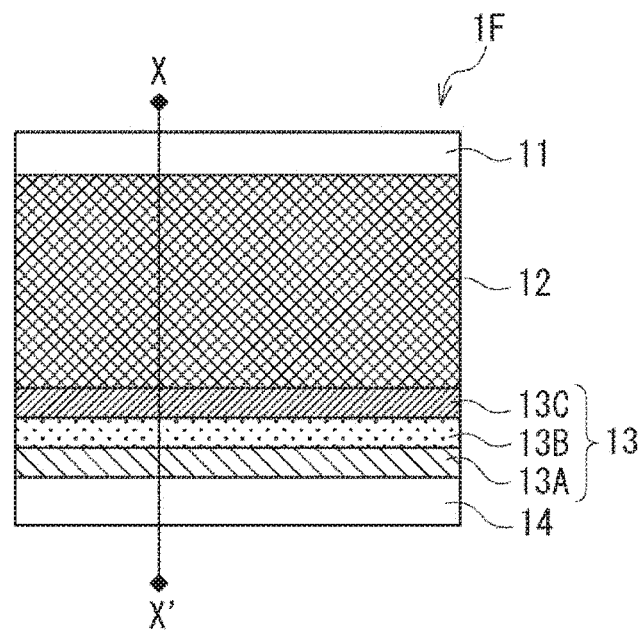
FIG. 13 is a cross-sectional structural diagram of a sixth embodiment of the photoelectric conversion element to which the present technology is applied.

FIG. 13 illustrates a cross-sectional structure of a photoelectric conversion element 1F as a sixth embodiment of the photoelectric conversion element 1 to which the present technology is applied.

In the sixth embodiment, description of components denoted with the same reference numerals as those in the first to fifth embodiments will be appropriately omitted.

The photoelectric conversion element 1F in FIG. 13 is common to the photoelectric conversion element 1E according to the fifth embodiment illustrated in FIG. 10 in that the photoelectric conversion element 1F has a laminated structure including an upper electrode 11, a photoelectric conversion layer 12, an electron blocking layer 13, and a lower electrode 14.

On the other hand, n the photoelectric conversion element 1E illustrated in FIG. 10, the electron blocking layer 13 includes two layers, i.e., the first electron blocking layer 13A and the second electron blocking layer 13B. Differently, in the photoelectric conversion element 1F in FIG. 13, the electron blocking layer 13 includes three layers, i.e., the first electron blocking layer 13A, the second electron blocking layer 13B, and a third electron blocking layer 13C.

An acceptor impurity densities of the first electron blocking layer 13A and the third electron blocking layer 13C are equal to or higher than 1e16/cm3, and the acceptor impurity density of the second electron blocking layer 13B is lower than 1e16/cm3. In other words, in three electron blocking layers 13A to 13C, the acceptor impurity densities on both outer sides are higher than the acceptor impurity density at the center. The acceptor impurity densities of the first electron blocking layer 13A and the third electron blocking layer 13C having higher acceptor impurity densities are preferably equal to or higher than 1e17/cm3 and are more preferably equal to or higher than 1e18/cm3.

Figure 14:
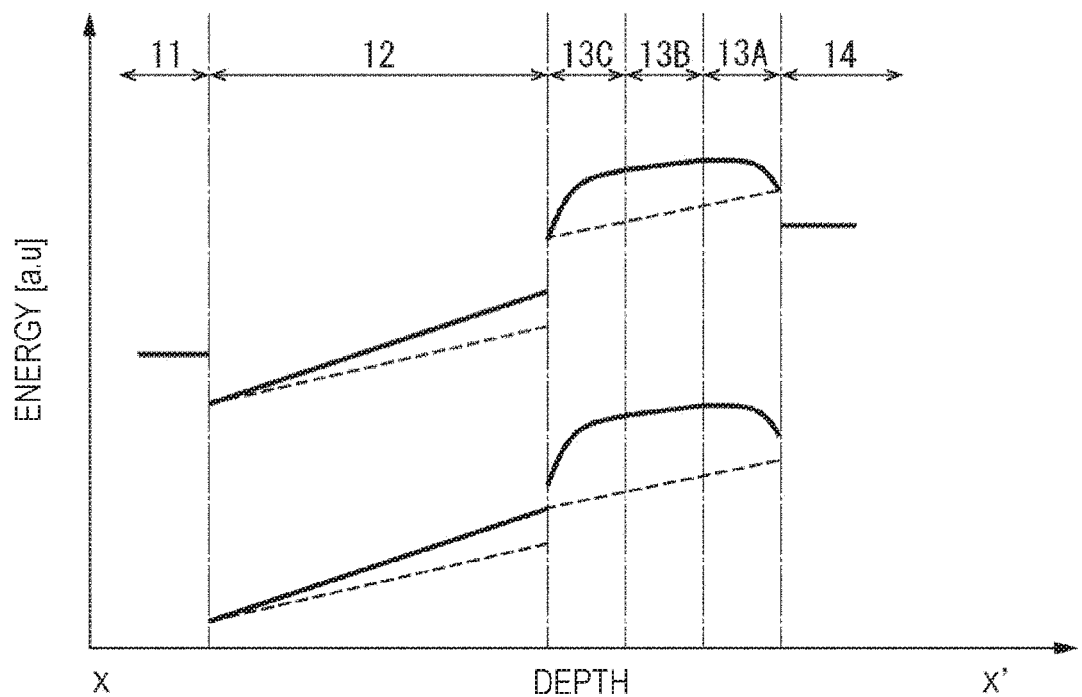
FIG. 14 is a chart of an energy diagram of the photoelectric conversion element in FIG. 13.

FIG. 14 illustrates an energy diagram of the photoelectric conversion element 1F taken long a line X-X' in FIG. 13.

An energy profile indicated by a solid line in FIG. 14 indicates an energy profile of the photoelectric conversion element 1F. On the other hand, for comparison, an energy profile indicated by a broken line in FIG. 14 indicates an energy profile in a case where a part of the electron blocking layer 13 includes a material having an ionization potential Ip and the electron affinity Ea same as those of the electron blocking layer 13 and a material to which an electric field is uniformly applied (no band bending).

As illustrated in FIG. 14, since the acceptor impurity densities of the first electron blocking layer 13A and the third electron blocking layer 13C are high, a band is bent. However, since the acceptor impurity density of the second electron blocking layer 13B is low, the band is flat. As a result, regarding the energy profile of the photoelectric conversion element 1F, a potential of the photoelectric conversion layer 12 becomes steep, and an electric field is strongly applied. Therefore, a quantum efficiency is improved. Furthermore, a difference between a work function WF of the lower electrode (negative electrode) 14 and the minimum value of the electron affinity Ea of the electron blocking layer 13 increases. As a result, electron injection from the lower electrode (negative electrode) 14 can be prevented, and a dark current to be a noise can be reduced.

A combination of the acceptor impurity densities of the three electron blocking layers 13A to 13C may be other than the combination described above. However, a structure is preferable in which the first electron blocking layer 13A and the third electron blocking layer 13C having high acceptor impurity density have contact with the photoelectric conversion layer 12 or the lower electrode (negative electrode) 14.

7. Seventh Embodiment of Photoelectric Conversion Element

Figure 15:
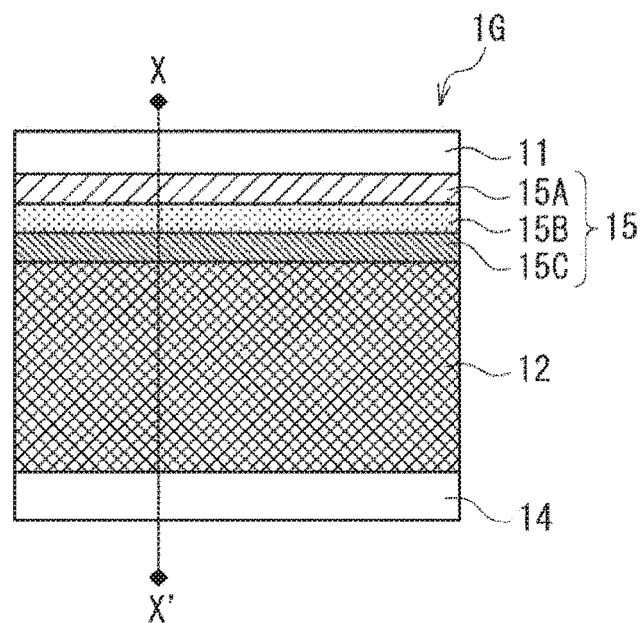
FIG. 15 is a cross-sectional structural diagram of a seventh embodiment of the photoelectric conversion element to which the present technology is applied.

FIG. 15 illustrates a cross-sectional structure of a photoelectric conversion element 1G as a seventh embodiment of the photoelectric conversion element 1 to which the present technology is applied.

In the seventh embodiment, description of components denoted with the same reference numerals as those in the first to sixth embodiments will be appropriately omitted.

The photoelectric conversion element 1G in FIG. 15 is common to the photoelectric conversion element 1D according to the fourth embodiment illustrated in FIG. 7 in that the photoelectric conversion element 1G has a laminated structure including an upper electrode 11, a hole blocking layer 15, a photoelectric conversion layer 12, and a lower electrode 14.

On the other hand, in the photoelectric conversion element 1D illustrated in FIG. 7, the hole blocking layer 15 includes two layers, i.e., the first hole blocking layer 15A and the second hole blocking layer 15B. Differently, in the photoelectric conversion element 1G in FIG. 15, the hole blocking layer 15 includes three layers including the first hole blocking layer 15A, the second hole blocking layer 15B, and a third hole blocking layer 15C.

Donor impurity densities of the first hole blocking layer 15A and the third hole blocking layer 15C are equal to or higher than 1e16/cm3, and a donor impurity density of the second hole blocking layer 15B is lower than 1e16/cm3. In other words, in the three hole blocking layers 15A to 15C, the donor impurity densities on the on both outer sides are higher than the donor impurity density at the center. The donor impurity densities of the first hole blocking layer 15A and the third hole blocking layer 15C having higher donor impurity densities are preferably equal to or higher than 1e17/cm3 and more preferably equal to or higher than 1e18/cm3.

Figure 16:
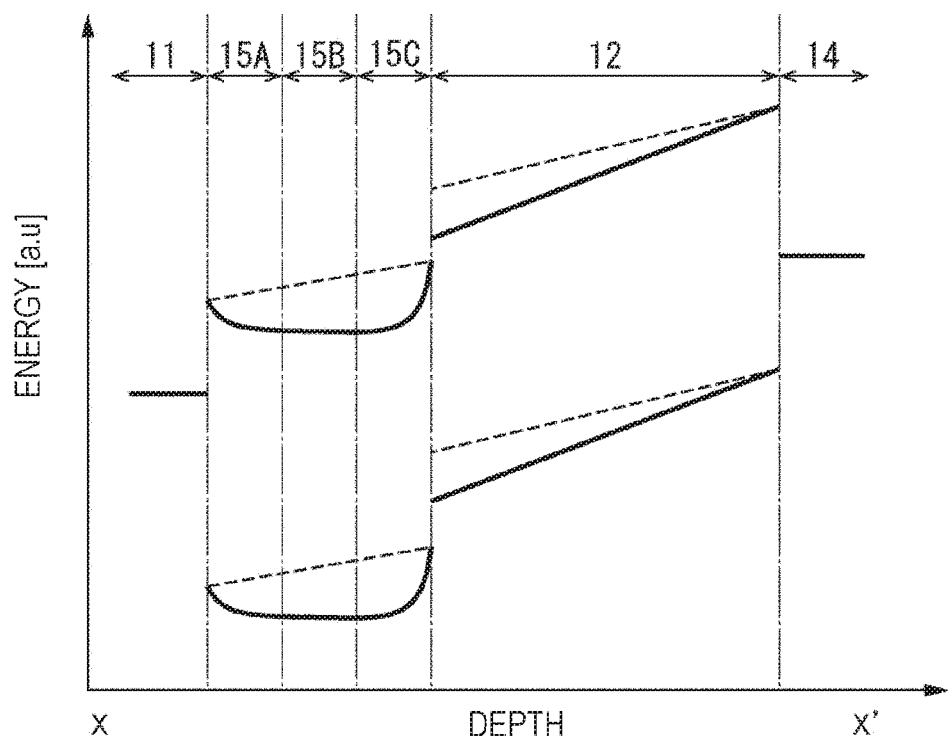
FIG. 16 is a chart of an energy diagram of the photoelectric conversion element in FIG. 15.

FIG. 16 illustrates an energy diagram of the photoelectric conversion element 1G taken long a line X-X' in FIG. 15.

An energy profile indicated by a solid line in FIG. 16 indicates an energy profile of the photoelectric conversion element 1G. On the other hand, for comparison, an energy profile indicated by a broken line in FIG. 16 indicates an energy profile in a case where a part of the hole blocking layer 15 includes a material having an ionization potential Ip and the electron affinity Ea same as those of the hole blocking layer 15 and a material to which an electric field is uniformly applied (no band bending).

In the first hole blocking layer 15A and the third hole blocking layer 15C, a band is bent due to the high donor impurity density. However, in the second hole blocking layer 15B, the band is flat due to the low donor impurity density. As a result, regarding the energy profile of the photoelectric conversion element 1G, a potential of the photoelectric conversion layer 12 becomes steep, and an electric field is strongly applied. Therefore, a quantum efficiency is improved. Furthermore, a difference between a work function WF of the upper electrode (positive electrode) 11 and the maximum value of an ionization potential Ip of the hole blocking layer 15 increases. As a result, hole injection from the upper electrode (positive electrode) 11 can be prevented, and a dark current to be a noise can be reduced.

A combination of the donor impurity densities of the three hole blocking layers 15A to 15C may be as described above. However, a structure is preferable in which the first hole blocking layer 15A and the third hole blocking layer 15C having the high donor impurity densities have contact with the upper electrode (positive electrode) 11 or the photoelectric conversion layer 12.

8. Summary of Embodiments

The structures according to the embodiments of the photoelectric conversion element 1 described above are summarized as follows.

In the photoelectric conversion element 1, when the charge blocking layer is the electron blocking layer 13 arranged between the upper electrode (positive electrode) 11 and the lower electrode (negative electrode) 14, the electron blocking layer 13 has following characteristics.

Figure 17:
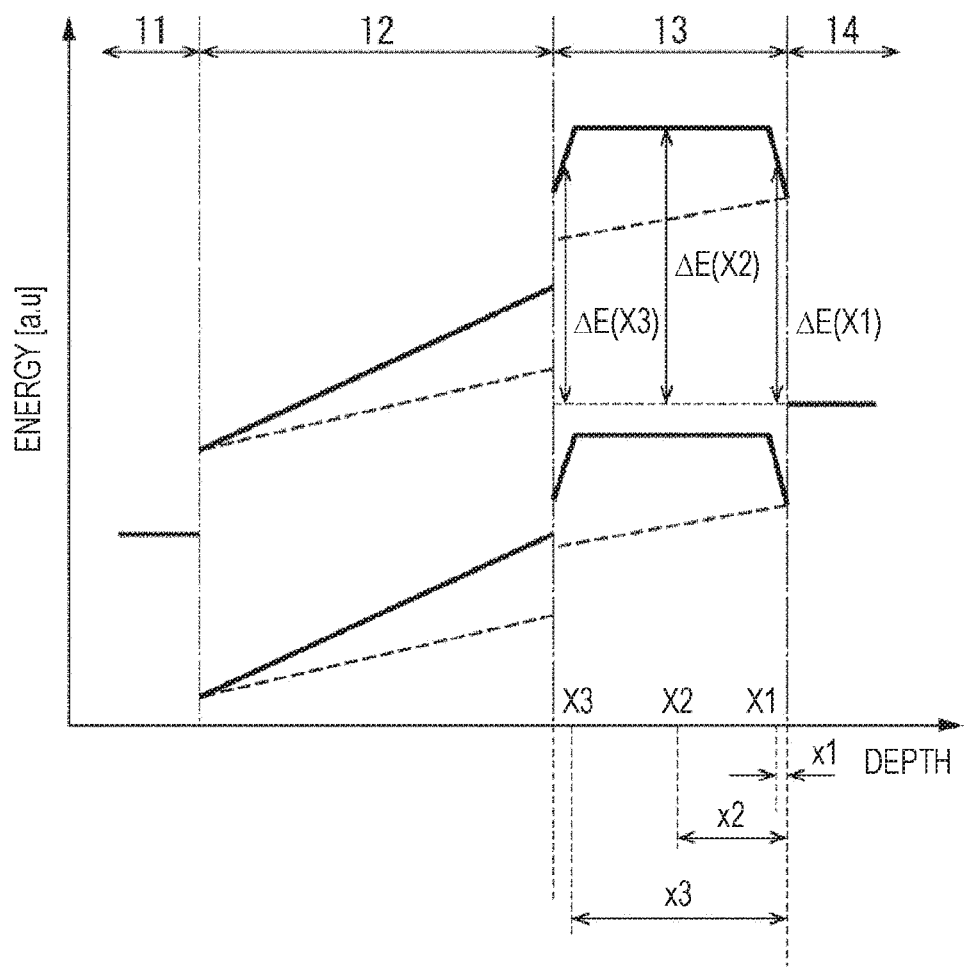
FIG. 17 is a diagram of embodiments of the photoelectric conversion element having the electron blocking layer.

As illustrated in FIG. 17, positions X1, X2, and X3 are located at predetermined distances x1, x2, and x3 (x1<x2<x3) from the interface between the electron blocking layer 13 and the lower electrode (negative electrode) 14 toward the photoelectric conversion layer 12, and a potential made by the electron blocking layer 13 is curved so that absolute values $\Delta E(X1)$, $\Delta E(X2)$, and $\Delta E(X3)$ of a difference between the electron affinity Ea of the electron blocking layer 13 and the work function WF of the lower electrode (negative electrode) 14 at each position satisfy the following formula (1).

$$\Delta E(X2) > \Delta E(X1) \text{ and } \Delta E(X2) > \Delta E(X3) \tag{1}$$

Furthermore, in FIG. 17, the characteristics of the electron blocking layer 13 is described by using the energy diagram of the photoelectric conversion element 1A according to the first embodiment. However, in all the embodiments including the electron blocking layer 13 can satisfy the condition of the formula (1).

Furthermore, in the photoelectric conversion element 1, when a charge blocking layer is the hole blocking layer 15 arranged between the upper electrode (positive electrode) 11 and the lower electrode (negative electrode) 14, the hole blocking layer 15 has the following characteristics.

Figure 18:
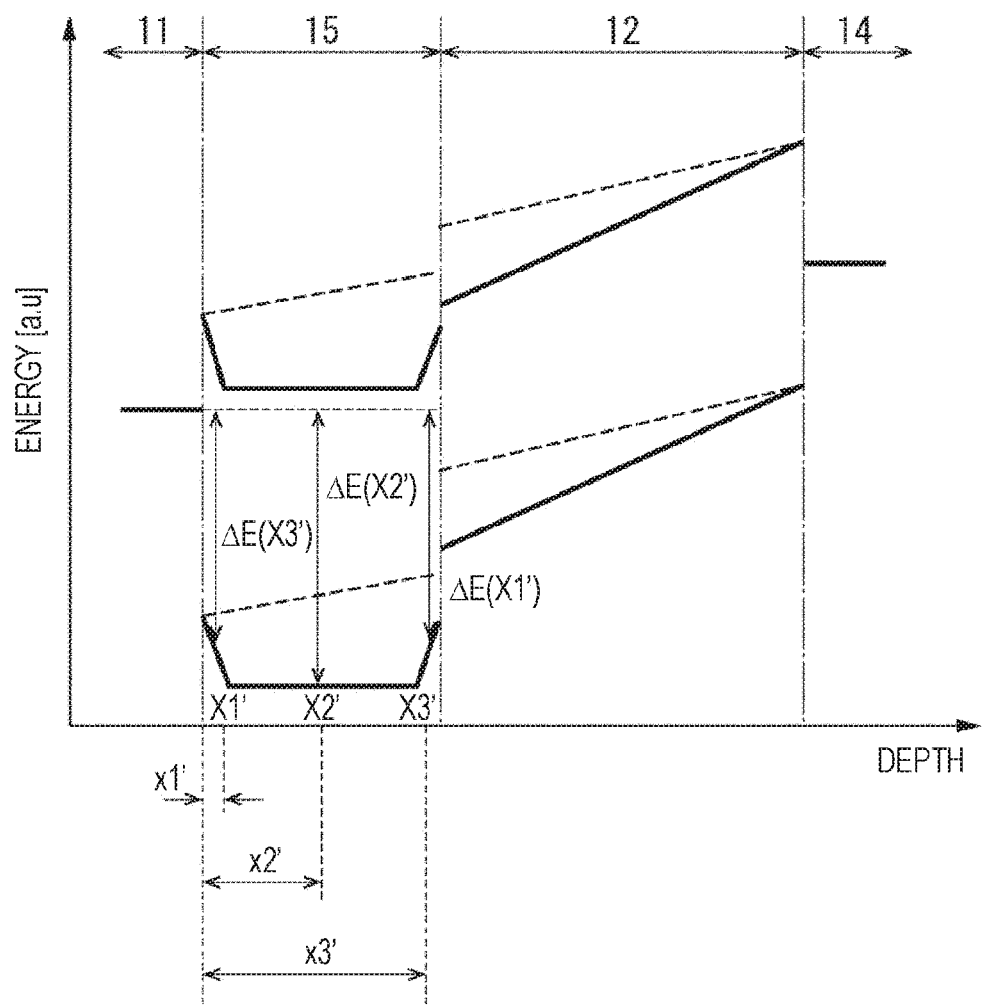
FIG. 18 is a diagram of embodiments of the photoelectric conversion element having the hole blocking layer.

As illustrated in FIG. 18, positions X1', X2', and X3' are located at predetermined distances x1', x2', and x3' (x1'<x2'<x3') from the interface between the hole blocking layer 15 and the upper electrode (positive electrode) 11 toward the photoelectric conversion layer 12, and a potential made by the hole blocking layer 15 is curved so that absolute values $\Delta E(X1')$, $\Delta E(X2')$, and $\Delta E(X3')$ of a difference between the work function WF of the upper electrode (positive electrode) 11 and the ionization potential Ip of the hole blocking layer 15 at each position satisfy the following formula (2).

$$\Delta E(X2') > \Delta E(X1') \text{ and } \Delta E(X2') > \Delta E(X3') \tag{2}$$

Furthermore, in FIG. 18, the characteristics of the hole blocking layer 15 is described by using the energy diagram of the photoelectric conversion element 1B according to the second embodiment. However, in all the embodiments including the hole blocking layer 15 can satisfy the condition of the formula (2).

With the characteristics of the electron blocking layer 13 and the hole blocking layer 15, a potential of the photoelectric conversion layer 12 becomes steep, and an electric field is strongly applied. Therefore, a quantum efficiency of the photoelectric conversion element 1 can be improved. Furthermore, when being used to apply the bias voltage, in addition to the improvement of the quantum efficiency, a dark current can be prevented, and a responsivity can be improved.

The electron blocking layer 13 and the hole blocking layer 15 as charge blocking layers can includes a single layer or a plurality of layers.

9. Method of Confirming Band Bending

Next, a method of confirming band bending of the charge blocking layer including the electron blocking layer 13 or the hole blocking layer 15 will be described.

Figure 19:
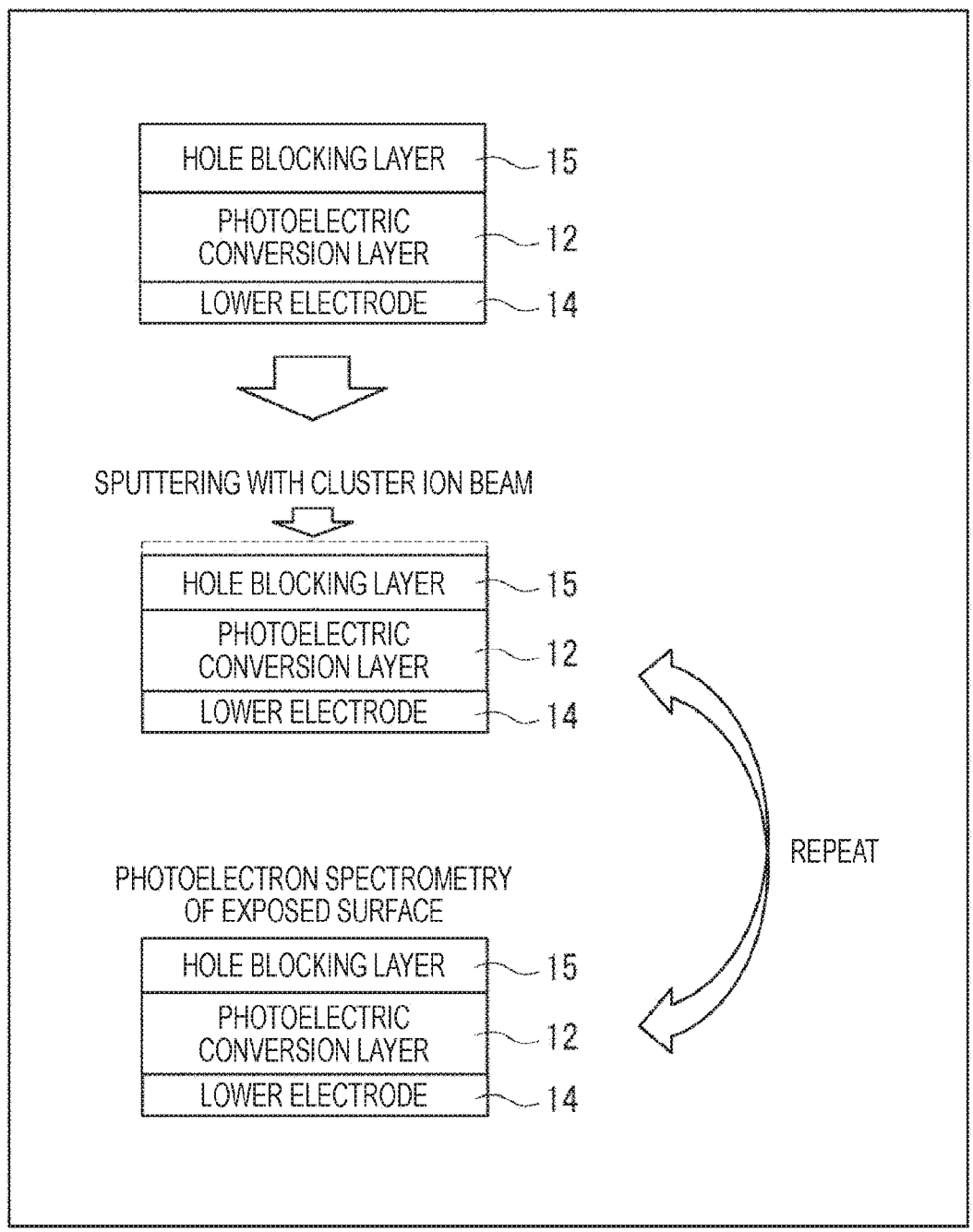
FIG. 19 is a diagram to describe a method of confirming band bending.

In a case where the charge blocking layer is the hole blocking layer 15, as illustrated in FIG. 19, the photoelectric conversion layer 12 is formed on the lower electrode 14, and the hole blocking layer 15 is formed on the photoelectric conversion layer 12.

After a surface layer of the hole blocking layer 15 is peeled by irradiating the surface layer of the hole blocking layer 15 with a gas cluster ion beam by a sputtering device which is not shown, photoelectron spectrometry of an exposed surface of the hole blocking layer 15 is performed by a photoelectron spectrophotometric device. By alternately repeating the sputtering of the gas cluster ion beam and the photoelectron spectrometry of the exposed surface of the hole blocking layer 15, a Highest Occupied Molecular Orbital (HOMO) of the hole blocking layer 15 and an energy level of an inner orbital can be continuously measured in the depth direction without destroying an intramolecular structure. Furthermore, in a case where an energy level of a Lowest Unoccupied Molecular Orbital (LUMO) is continuously measured, inverse photoelectron spectrometry of the exposed surface of the hole blocking layer 15 is performed by using an inverse photoelectron spectrophotometric device.

Figure 20:
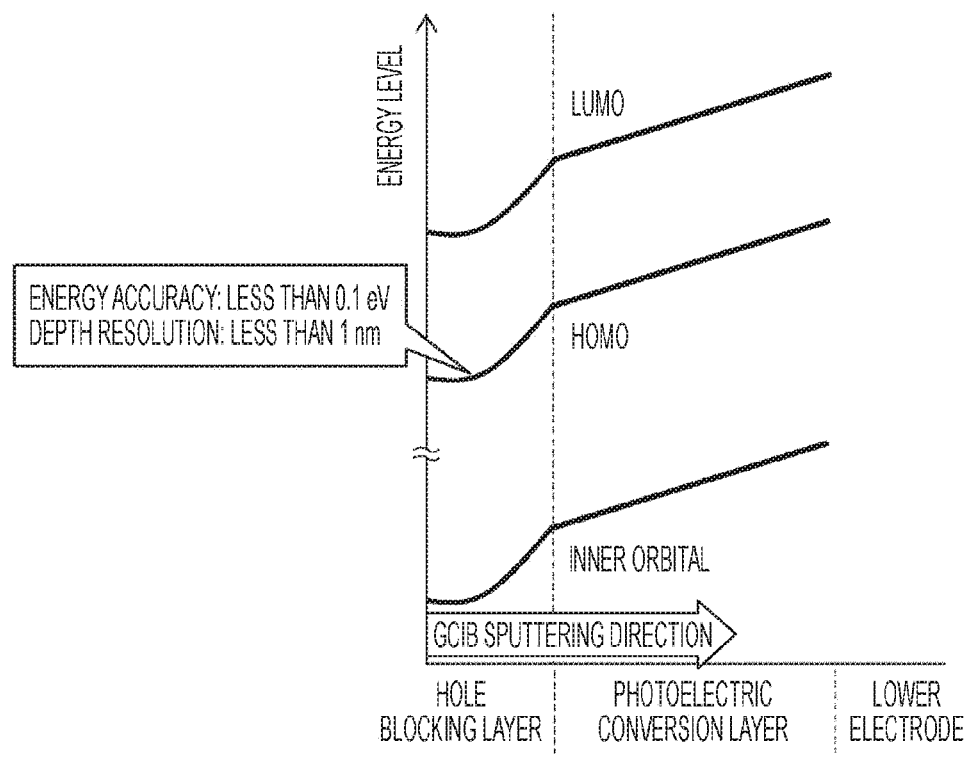
FIG. 20 is a conceptual diagram of measurement results of energy levels of the band bending.

FIG. 20 is a conceptual diagram of measurement results in a case where the HOMO and the LUMO of the hole blocking layer 15 and the photoelectric conversion layer 12 and the energy level of the inner orbital are measured by the above method.

The horizontal axis in FIG. 20 corresponds to the depth direction of the hole blocking layer 15, the photoelectric conversion layer 12, and the lower electrode 14, and as indicated by an arrow in a GCIB sputtering direction in FIG. 20, sputtering is sequentially performed from the left side to the right side to measure the energy level.

Figure 21:
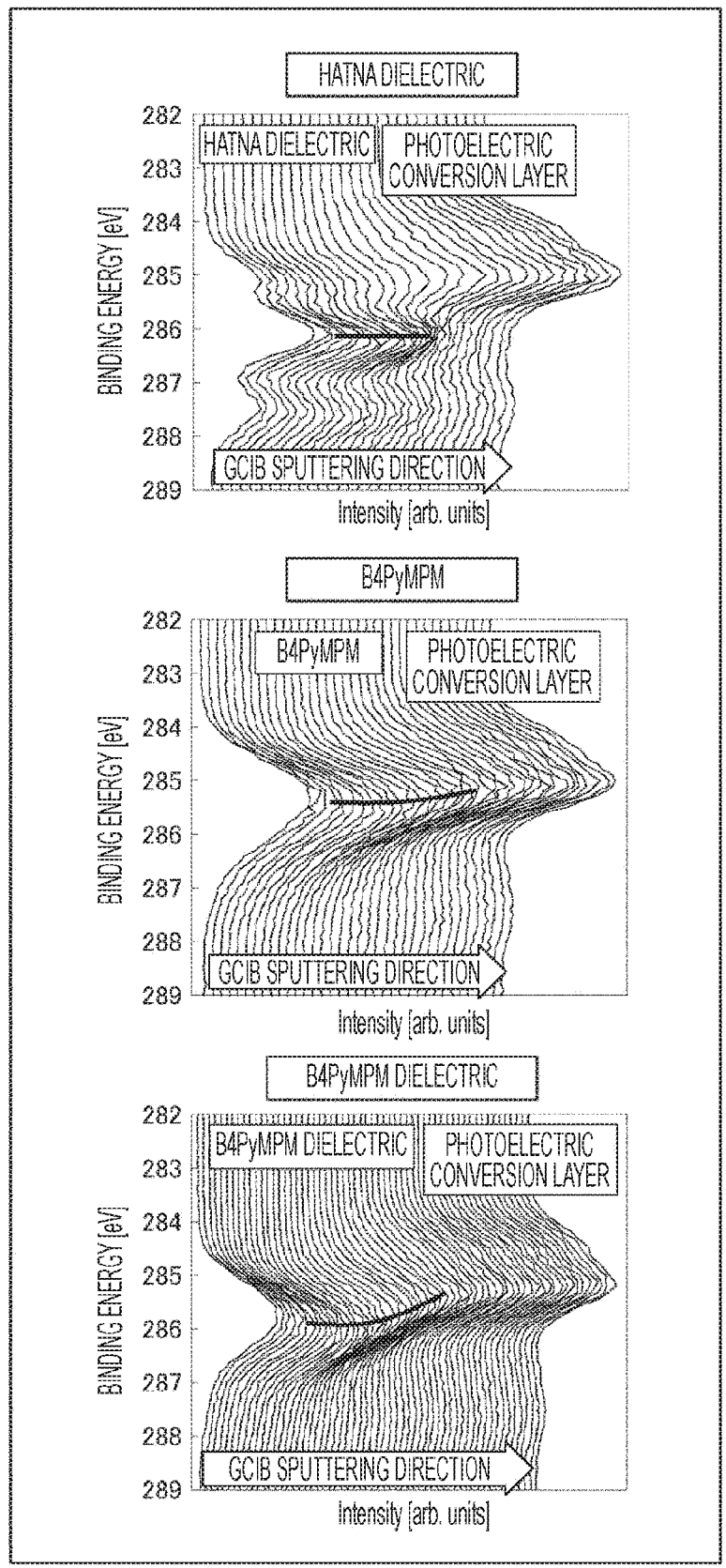
FIG. 21 is a diagram of gas cluster X-ray photoelectron spectroscopy C1s spectra of the hole blocking layer and an photoelectric conversion layer.

FIG. 21 illustrates gas cluster X-ray photoelectron spectroscopy C1s spectra of the hole blocking layer 15 and the photoelectric conversion layer 12 in a case where a HATNA dielectric, B4PyMPM, or a B4PyMPM dielectric are employed as the hole blocking material indicating band bending.

In each C1s spectrum in FIG. 21, as indicated by a thick solid line, even in a case where any one of a HATNA dielectric, B4PyMPM, or a B4PyMPM dielectric is employed as the hole blocking material, the band bending is observed, and a band bent width of the HATNA dielectric is the smallest, and a band bent width of the B4PyMPM dielectric is the largest.

Figure 22:
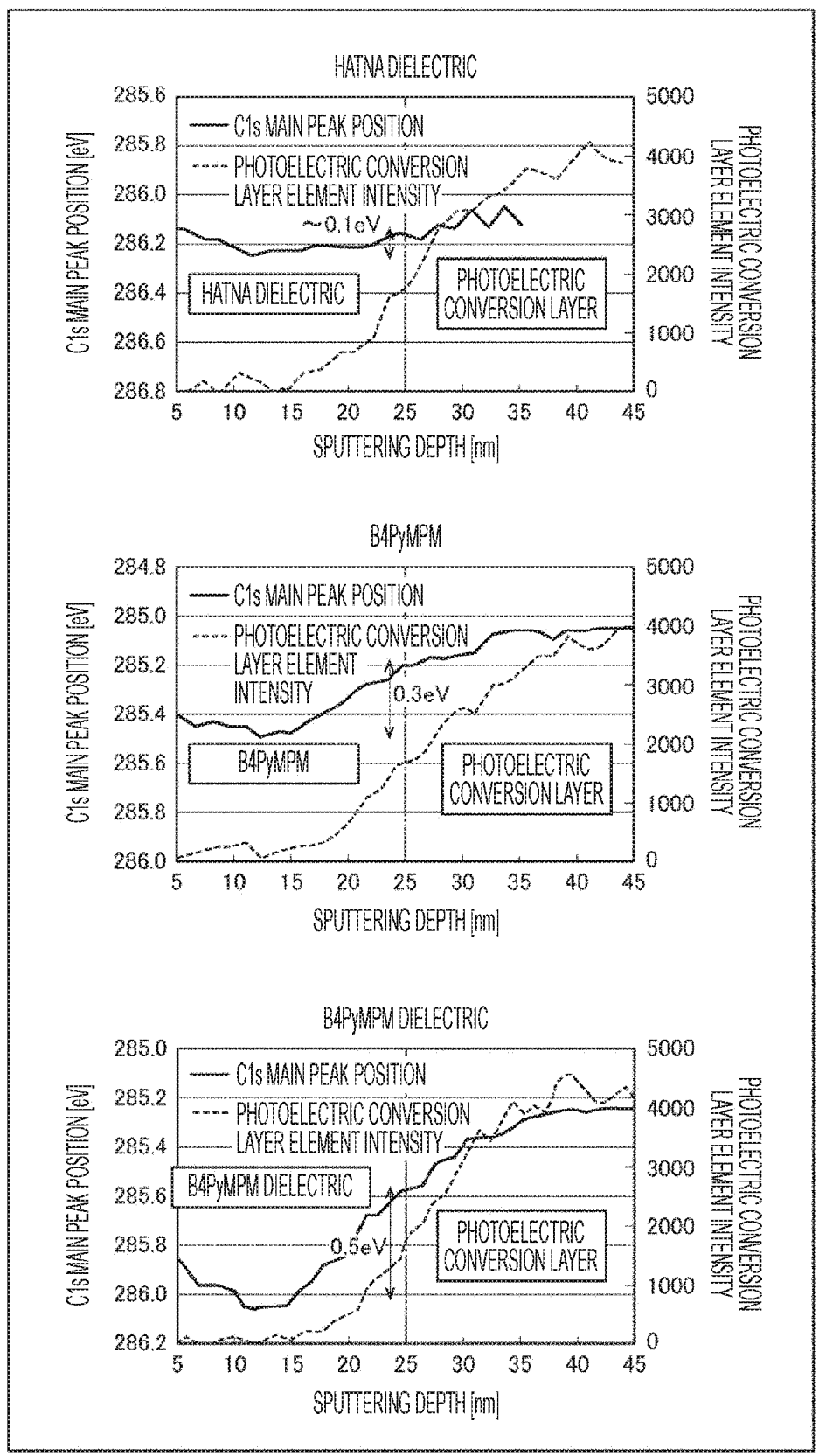
FIG. 22 is a detailed diagram of the gas cluster X-ray photoelectron spectroscopy C1s spectra near an interface between the hole blocking layer and the photoelectric conversion layer.

FIG. 22 is a detailed diagram of the vicinity of the interface between the hole blocking layer 15 and the photoelectric conversion layer 12.

A solid line waveform indicated by each graph in FIG. 22 indicates an energy level at a main peak position of the C1s spectrum in FIG. 21, and the value is indicated by the scale on the left.

A broken line waveform indicated by each graph in FIG. 22 indicates a photoelectron intensity of a predetermined element included in the photoelectric conversion layer 12, and the value is indicated by the scale on the right. The interface between the hole blocking layer 15 and the photoelectric conversion layer 12 estimated by the observed photoelectron intensity of the predetermined element of the photoelectric conversion layer 12 is indicated by an alternate long and short dash line.

Comparing the cases where the material of the hole blocking layer 15 is a HATNA dielectric, B4PyMPM, and a B4PyMPM dielectric, it is found that the band bent width is 0.1 [eV] in a case of the HATNA dielectric and 0.3 [eV] in a case of B4PyMPM, and 0.5 [eV] in a case of the B4PyMPM dielectric.

As described above, by alternately repeating the sputtering of the gas cluster ion beam and the photoelectron spectrometry of the exposed surface of the hole blocking layer 15, the band bending of the hole blocking layer 15 can be confirmed without destroying an intramolecular structure.

In the above example, the charge blocking layer is the hole blocking layer 15. However, the band bending can be similarly confirmed in a case where the charge blocking layer is the electron blocking layer 13.

10. Embodiment of Solid-State Imaging Device

Next, an exemplary configuration of a solid-state imaging device using the photoelectric conversion element 1 as a photoelectric conversion unit will be described.

Figure 23:
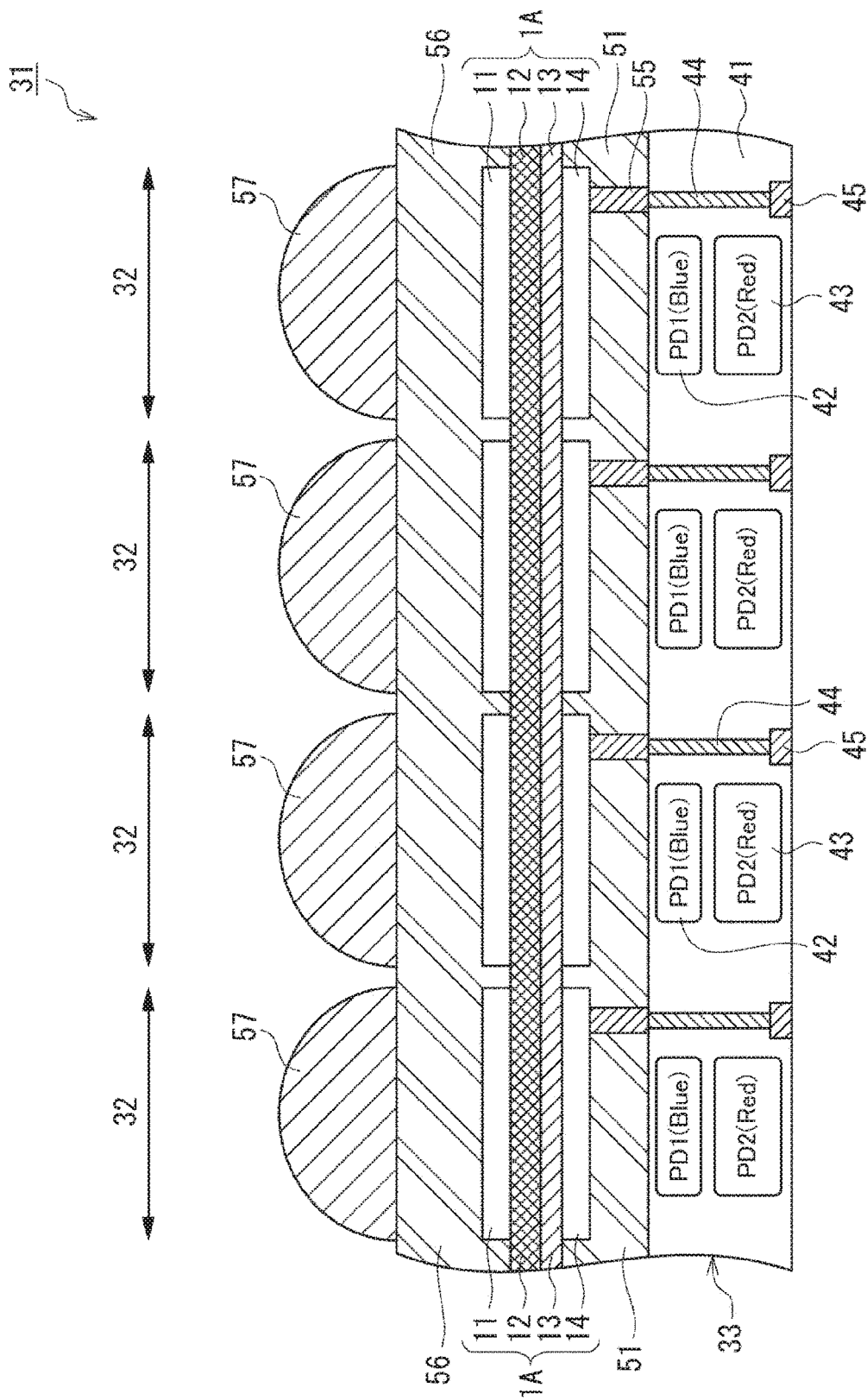
FIG. 23 is a cross-sectional view of a solid-state imaging device using the photoelectric conversion element in FIG. 1 as a photoelectric conversion unit.

FIG. 23 is a cross-sectional view of a solid-state imaging device 31 using the photoelectric conversion element 1 as a photoelectric conversion unit.

Note that, FIG. 23 is a cross-sectional view of the solid-state imaging device 31, particularly, a pixel array unit in which pixels 32 are two-dimensionally arranged in a matrix and is an example in which the configuration of the photoelectric conversion element 1A according to the first embodiment is employed as the photoelectric conversion element 1.

Second conductivity type (for example, N type) semiconductor regions 42 and 43 are laminated and formed along the depth direction in a first conductivity type (for example, P type) semiconductor region 41 of a semiconductor substrate 33 so that photodiodes PD1 and PD2 formed by PN junction are formed along the depth direction. The photodiode PD1 using the semiconductor region 42 as a charge accumulating region is a photoelectric conversion unit for receiving blue light and photoelectrically converts the light, and the photodiode PD2 using the semiconductor region 43 as a charge accumulating region is a photoelectric conversion unit for receiving red light and photoelectrically converting the light.

On a side of a principal surface of the semiconductor substrate 33 (lower side in FIG. 23), a plurality of pixel transistors, for example, for reading charges accumulated in the photodiodes PD1 and PD2 and a multilayer wiring layers is formed that includes a plurality of wiring layers and interlayer insulating films are formed. However, the illustration thereof is omitted in FIG. 23.

In the semiconductor substrate 33, a conductive plug 44 for extracting the charges photoelectrically converted by the photoelectric conversion element 1A to the side of the principal surface of the substrate (lower side in FIG. 23) is provided through (the semiconductor region 41 of) the semiconductor substrate 33. Note that, although not illustrated, an outer periphery of the conductive plug 44 is insulated with an insulating film of SiO2, SiN, or the like.

The conductive plug 44 is connected to a charge holding unit 45 including the second conductive type (for example, N type) semiconductor region in the semiconductor region 41. The charge holding unit 45 temporarily holds the charges photoelectrically converted by the photoelectric conversion element 1A until the charges are read.

At the interface on the rear surface side of the semiconductor substrate 33, (upper side in FIG. 23) for example, a transparent insulating film 51 including two or three layers of a hafnium oxide (HfO2) film and a silicon oxide film is formed.

On the upper side of the transparent insulating film 51, the photoelectric conversion element 1A illustrated in FIG. 1 is arranged. The photoelectric conversion element 1A photoelectrically converts green wavelength light. As a combination of an electron donating material and an electron accepting material having sensitivity with respect to only green in the photoelectric conversion layer 12, for example, a combination of organic materials of a quinacridone compound (electron donating material) and a perylene compound (electron accepting material) can be considered as an example.

Furthermore, as a combination of an electron donating material and an electron accepting material film in a case where the photoelectric conversion layer 12 is a photoelectric conversion film having sensitivity with respect to only read, for example, a combination of organic materials of a phthalocyanine compound (electron donating material) and a fluorine-substituted phthalocyanine compound (electron accepting material) can be considered as an example.

As a combination of an electron donating material and an electron accepting material film in a case where the photoelectric conversion layer 12 is a photoelectric conversion layer having sensitivity with respect to only blue, for example, a combination of organic materials of a coumarin compound (electron donating material) and a silole compound (electron accepting material) can be considered as an example.

In the example in FIG. 23, the upper electrode 11 and the lower electrode 14 are formed for each pixel unit, and the lower electrode 14 is connected to the conductive plug 44 of the semiconductor substrate 33 with metal wiring 55 passing through the transparent insulating film 51. The metal wiring 55 includes, for example, tungsten (W), aluminum (Al), copper (Cu), and the like.

On the upper surface of the upper electrode 11, a high refractive index layer 56 includes an inorganic film such as a silicon nitride film (SiN), a silicon oxynitride film (SiON), and silicon carbide (SiC). Furthermore, on the high refractive index layer 56, an on-chip lens 57 is formed. For a material of the on-chip lens 57, for example, a silicon nitride film (SiN) or a resin material is used such as a styrene resin, an acrylic resin, a styrene-acrylic copolymer resin, or a siloxane resin is used. The high refractive index layer 56 and the on-chip lens 57 can include the same material.

The solid-state imaging device 31 configured as described above is a rear-surface irradiation type CMOS solid-state imaging device in which light enters from a rear surface side opposite to the principal surface side of the semiconductor substrate 33 where the pixel transistor is formed.

Since the photoelectric conversion element 1 is included as a part of the photoelectric conversion unit of the solid-state imaging device 31, a quantum efficiency can be improved in photoelectric conversion for photoelectrically converting green wavelength light.

Note that the solid-state imaging device 31 is a vertical spectroscopic solid-state imaging device that photoelectrically converts the green wavelength light by the photoelectric conversion element 1A formed outside the semiconductor substrate (silicon layer) 33 and photoelectrically converts the blue and red wavelength light by the photodiodes PD1 and PD2 in the semiconductor substrate 33. Without using such as vertical spectroscopic solid-state imaging device, the photoelectric conversion element 1 can be used as a photoelectric conversion film of a solid-state imaging device in which color filters of the Bayer array on the photoelectric conversion film with a so-called panchromatic film having sensitivity across an entire wavelength range of visible light. In this case, the photodiodes PD1 and PD2 in the semiconductor substrate 33 are not formed. Therefore, for the lower electrode 14, for example, metals such as aluminum, vanadium, gold, silver, platinum, iron, cobalt, carbon, nickel, tungsten, palladium, magnesium, calcium, tin, lead, titanium, yttrium, lithium, ruthenium, manganese, and alloys thereof can be used.

Furthermore, in the example in FIG. 23, both the upper electrode 11 and the lower electrode 14 are formed for each pixel unit. However, it is sufficient that at least one of the electrodes be formed for each pixel unit. In addition, in the example in FIG. 23, the configuration of the photoelectric conversion element 1A according to the first embodiment is employed as the photoelectric conversion element 1. However, any one of the photoelectric conversion elements 1A to 1G may be employed.

<11. Method of Manufacturing Photoelectric Conversion Element>

Next, a method of manufacturing the photoelectric conversion element 1A will be described with reference to FIGS. 24A, 24B, 24C, and 24D.

Figure 24A:
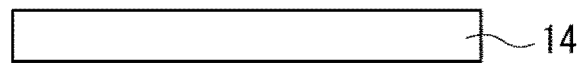
FIGS. 24A, 24B, 24C, and 24D are diagrams to describe a method of manufacturing the photoelectric conversion element in FIG. 1.

First, as illustrated in FIG. 24A, for example, by patterning an ITO film relative to a predetermined region by lithography, the lower electrode 14 which is the lowermost layer in the photoelectric conversion element 1A is formed.

Figure 24B:
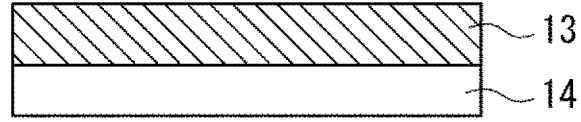

Next, as illustrated in FIG. 24B, by performing vacuum deposition on the electron blocking material indicating band bending, the electron blocking layer 13 is formed on the lower electrode 14. Here, an acceptor impurity density of the electron blocking layer 13 is, for example, equal to or higher than 1e16/cm3.

Figure 24C:
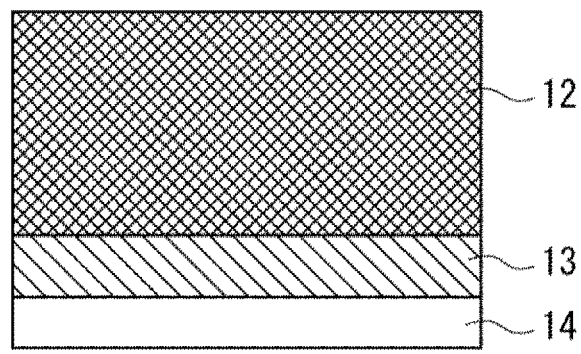

Next, as illustrated in FIG. 24C, by performing vacuum deposition on the predetermined electron donating material and electron accepting material, the photoelectric conversion layer 12 is formed on the electron blocking layer 13.

Figure 24D:
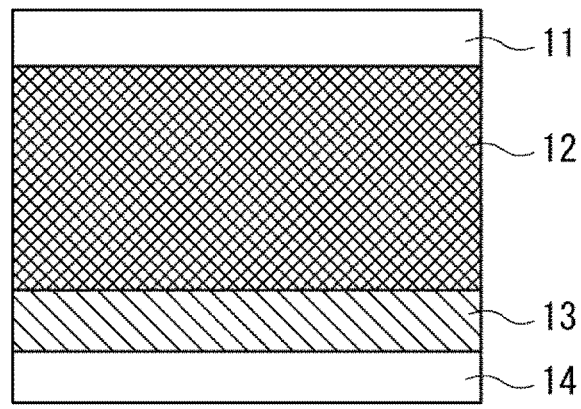

Finally, as illustrated in FIG. 24D, for example, by forming the ITO film of the same kind as the lower electrode 14, the upper electrode 11 is formed on the photoelectric conversion layer 12.

As described above, the photoelectric conversion element 1A can be formed by sequentially laminating the layers from the lower side. The photoelectric conversion elements 1B to 1G according to other embodiments can be similarly manufactured.

Note that, although the photoelectric conversion layer 12 and the electron blocking layer 13 are formed by vacuum deposition in the above example, the photoelectric conversion layer 12 and the electron blocking layer 13 can be formed by a solution process.

12. Example of Application to Electronic Device

The present technology is not limited to application to the solid-state imaging device. In other words, the present technology can be applied to all the electronic devices using the solid-state imaging device as an image taking unit (photoelectric conversion unit) including an imaging device such as a digital still camera and a video camera, a mobile terminal device having an imaging function, a copying machine using the solid-state imaging device in an image reading unit, and the like. The solid-state imaging device may have a form formed as a single chip and may be a module-like shape having an imaging function in which an imaging unit, a signal processing unit or an optical system are collectively packaged.

Figure 25:
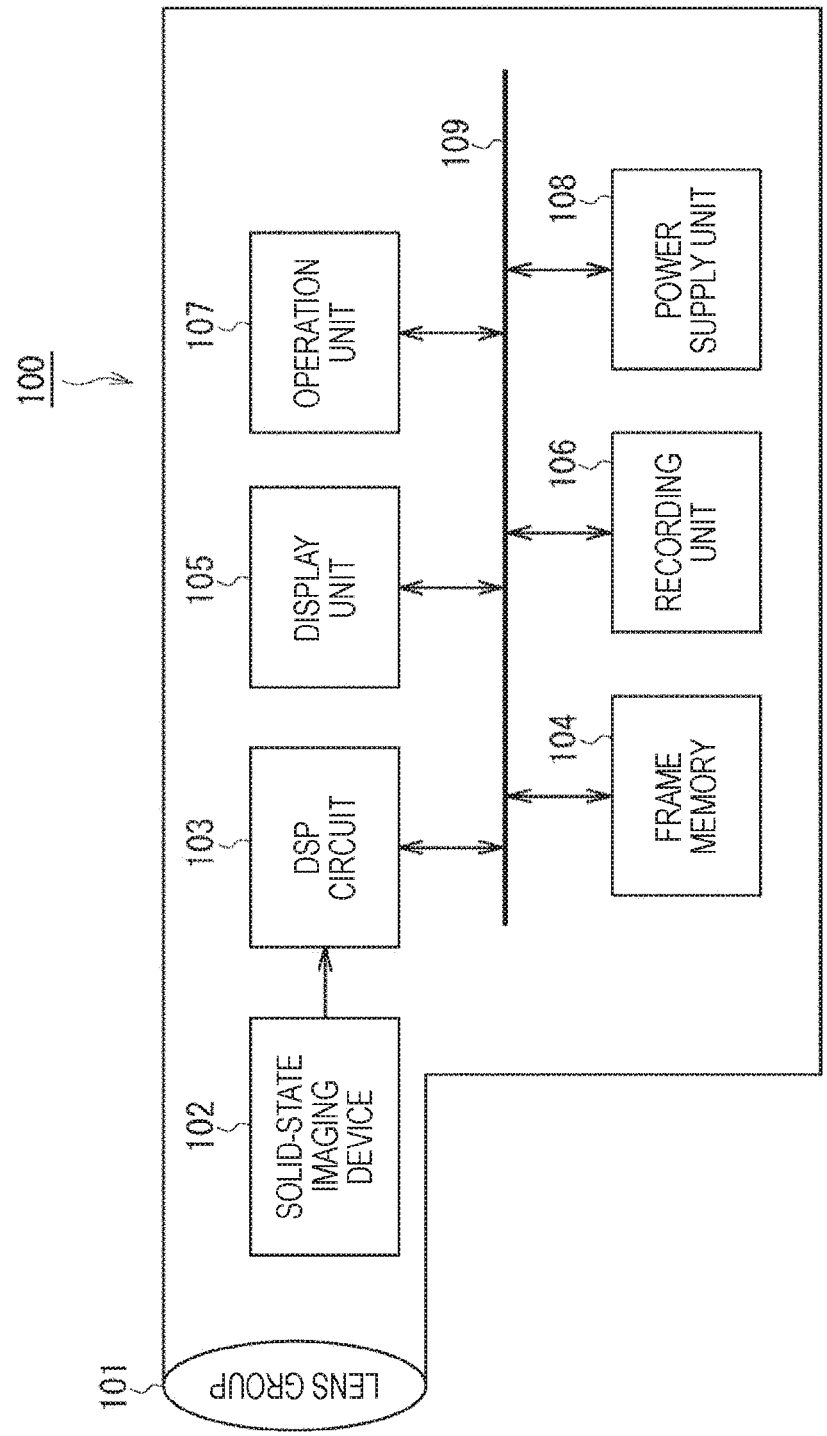
FIG. 25 is a block diagram of an exemplary configuration of an imaging device as an electronic device to which the present technology is applied.

FIG. 25 is a block diagram of an exemplary configuration of an imaging device as an electronic device to which the present technology is applied.

An imaging device 100 in FIG. 25 includes an optical unit 101 including a lens group and the like, a solid-state imaging device (imaging device) 102 employing the configuration of the solid-state imaging device 31 in FIG. 23, and a Digital Signal Processor (DSP) circuit 103 which is a camera signal processing circuit. Furthermore, the imaging device 100 includes a frame memory 104, a display unit 105, a recording unit 106, an operation unit 107, and a power supply unit 108. The DSP circuit 103, the frame memory 104, the display unit 105, the recording unit 106, the operation unit 107, and the power supply unit 108 are mutually connected via a bus line 109.

The optical unit 101 captured incident light (image light) from a subject and forms an image on an imaging surface of the solid-state imaging device 102. The solid-state imaging device 102 converts a light amount of the incident light imaged on the imaging surface by the optical unit 101 into an electric signal in pixel units and outputs the converted signals as a pixel signal. As the solid-state imaging device 102, the solid-state imaging device 31 in FIG. 23, that is, a solid-state imaging device that includes the photoelectric conversion element 1 for improving an quantum efficiency and preventing a dark current can be used.

The display unit 105 includes, for example, a panel type display device such as a liquid crystal panel and an organic Electro Luminescence (EL) panel and displays a moving image or a still image imaged by the solid-state imaging device 102. The recording unit 106 records the moving image or the still image imaged by the solid-state imaging device 102 on a recording medium such as a hard disk or a semiconductor memory.

The operation unit 107 issues an instruction for operating various functions of the imaging device 100 under a user's operation. The power supply unit 108 appropriately supplies various power sources to be an operation power source of the DSP circuit 103, the frame memory 104, the display unit 105, the recording unit 106, and the operation unit 107 to the components which are supply targets.

As described above, by using the solid-state imaging device 31 including the photoelectric conversion element 1 as the solid-state imaging device 102, high sensitivity can be realized. Accordingly, even in the imaging device 100 such as a video camera, a digital still camera, and a camera module for a mobile device such as a cellular phone, an image quality of the imaged image can be enhanced.

<Exemplary Usage of Image Sensor>

Figure 26:
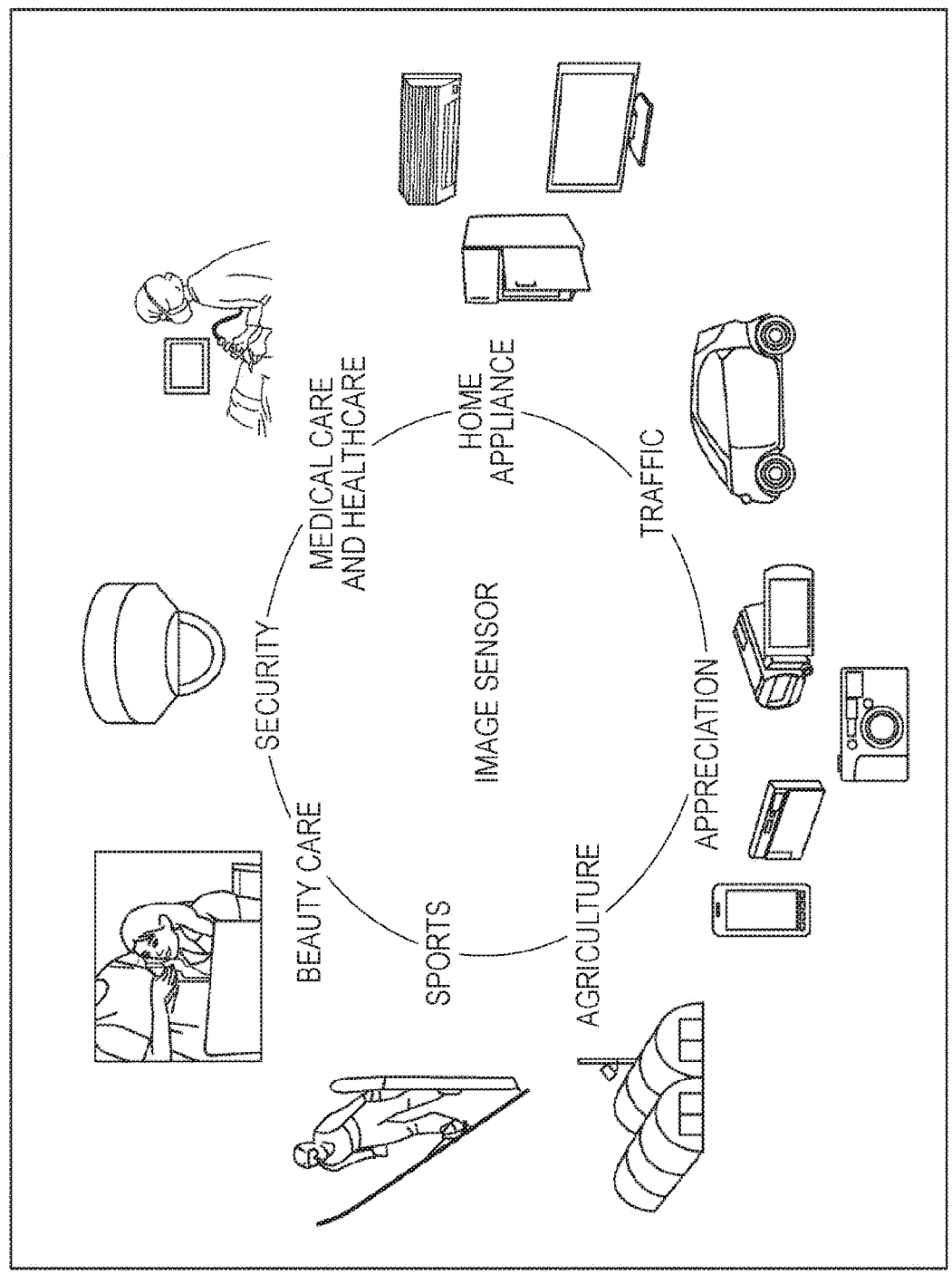
FIG. 26 is a diagram to describe an exemplary usage of the solid-state imaging device in FIG. 23.

FIG. 26 is a diagram of an exemplary usage in a case where the solid-state imaging device 31 is used as an image sensor.

The image sensor described above can be used, for example, in various cases in which light such as visible light, infrared light, ultraviolet light, and X-rays are sensed as follows.

A device which images an image to be used for appreciation, such as a digital camera and a portable device with a camera function A device which is used for traffic, such as an in-vehicle sensor for imaging the front, rear, surroundings, inside, and the like of a car for safe driving such as automatic stop, recognition of a driver's state, and the like, a monitoring camera for monitoring a traveling vehicle and a road, a distance measuring sensor for measuring a distance between vehicles, and the like A device which is used for home appliances, such as a TV, a refrigerator, an air conditioner to image a gesture of a user and operates the device according to the gesture A device which is used for medical care and healthcare, such as an endoscope, a device for performing angiography by receiving infrared light A device which is used for security, such as a security monitoring camera and a camera for person authentication A device which is used for beauty care, such as a skin measuring instrument for photographing skin and a microscope for photographing a scalp A device which is used for sports, such as an action camera, a wearable camera for sports, and the like A device which is used for agriculture, such as a camera for monitoring conditions of fields and crops An embodiment of the present technology is not limited to the embodiments described above, and various modifications can be made without departing from the scope of the present technology.

The photoelectric conversion element 1 is not limited to the photoelectric conversion unit of the solid-state imaging device and can be used as a solar cell. In a case where the photoelectric conversion element 1 is used as a solar cell, as a material for one of the upper electrode 11 and the lower electrode 14 that is not the light entering side, for example, metals such as aluminum, vanadium, gold, silver, platinum, iron, cobalt, carbon, nickel, tungsten, palladium, magnesium, calcium, tin, lead, titanium, yttrium, lithium, ruthenium, manganese, and alloys thereof can be used. Furthermore, the solar cell using the photoelectric conversion element 1 can be used as a power supply of an electronic device such as a watch, a cellular phone, and a mobile personal computer.

In the embodiments described above, the materials exemplified as the materials of the layers and the electrodes included in the photoelectric conversion element 1 are merely examples, and the material is not limited to the materials described herein.

In the exemplary configuration of the solid-state imaging device 31, a solid-state imaging device has been described in which the first conductivity type of the semiconductor substrate 33 is P type, the second conductivity type is N type, and the electrons are signal charges. However, the present technology can be applied to a solid-state imaging device having holes as signal charges. In other words, as assuming that the first conductivity type be N type and the second conductivity type be P type, each of the semiconductor regions can include a semiconductor region having an opposite conductivity.

Furthermore, the application of the present technology is not limited to an application to the solid-state imaging device for detecting a distribution of an amount of incident light of visible light and images the distribution as an image. The present technology can be applied to all solid-state imaging devices (physical quantity distribution detection device) such as a solid-state imaging device which images a distribution of an entered amount of infrared rays, X-rays, particles, or the like as an image and a fingerprint detection sensor which detects a distribution of other physical quantity, such as a pressure and an electrostatic capacitance and images an image.

A form in which a part of or all of the plurality of embodiments are combined can be employed.

Note that the effects described herein are only exemplary and not limited to these. There may be an additional effect other than those described herein.

Note that the present technology can have the configuration below.

(1) A photoelectric conversion element including:
two electrodes forming a positive electrode and a negative electrode;
at least one charge blocking layer arranged between the two electrodes; and
a photoelectric conversion layer arranged between the two electrodes, in which
when the at least one charge blocking layer is an electron blocking layer,
positions X1, X2, and X3 are located at predetermined distances x1, x2, and x3 (x1<x2<x3) from an interface between the electron blocking layer and the negative electrode toward the photoelectric conversion layer, and absolute values ΔE(X1), ΔE(X2), and ΔE(X3) of a difference between an electron affinity Ea of the electron blocking layer and a work function WF of the negative electrode at each position satisfy a following formula (1), $$\Delta E(X2) > \Delta E(X1) \text{ and } \Delta E(X2) > \Delta E(X3) \quad (1),$$

and
when the at least one charge blocking layer is a hole blocking layer,
positions X1', X2', and X3' are located at predetermined distances x1', x2', and x3' (x1'<x2'<x3') from an interface between the hole blocking layer and the positive electrode toward the photoelectric conversion layer, and absolute values ΔE(X1'), ΔE(X2'), and ΔE(X3') of a difference between a work function WF of the positive electrode and an ionization potential Ip of the hole blocking layer at each position satisfy a following formula (2), $$\Delta E(X2') > \Delta E(X1') \text{ and } \Delta E(X2') > \Delta E(X3') \quad (2)$$

(2) The photoelectric conversion element according to (1), in which
the at least one charge blocking layer is a single layer of the electron blocking layer.

(3) The photoelectric conversion element according to (1), in which
the at least one charge blocking layer is a single layer of the hole blocking layer.

(4) The photoelectric conversion element according to (1), in which
the at least one charge blocking layer is configured of two layers of charge blocking layers including the single layer of the electron blocking layer and the single layer of the hole blocking layer.

(5) The photoelectric conversion element according to (1), in which
the at least one charge blocking layer is configured of two layers of hole blocking layers including a first hole blocking layer and a second hole blocking layer having different donor impurity densities.

(6) The photoelectric conversion element according to (5), in which
the first hole blocking layer is a layer with a donor impurity density equal to or higher than 1e16/cm3, and
the second hole blocking layer is a layer with a donor impurity density lower than 1e16/cm3.

(7) The photoelectric conversion element according to (5) or (6), in which
the first hole blocking layer has contact with the positive electrode, and
the second hole blocking layer has contact with the photoelectric conversion layer.

(8) The photoelectric conversion element according to (5) or (6), in which
the first hole blocking layer has contact with the photoelectric conversion layer, and
the second hole blocking layer has contact with the positive electrode.

(9) The photoelectric conversion element according to (1), in which
the at least one charge blocking layer is configured of two electron blocking layers including a first electron blocking layer and a second electron blocking layer having different acceptor impurity densities.

(10) The photoelectric conversion element according to (9), in which
the first electron blocking layer is a layer with an acceptor impurity density equal to or higher than 1e16/cm3, and
the second electron blocking layer is a layer with an acceptor impurity density lower than 1e16/cm3.

(11) The photoelectric conversion element according to (9) or (10), in which
the first electron blocking layer has contact with the negative electrode, and
the second electron blocking layer has contact with the photoelectric conversion layer.

(12) The photoelectric conversion element according to (9) or (10), in which
the first electron blocking layer has contact with the photoelectric conversion layer, and
the second electron blocking layer has contact with the negative electrode.

(13) The photoelectric conversion element according to any one of (1) to (12), in which
the at least one charge blocking layer is configured of three hole blocking layers including a first and second hole blocking layers and a third hole blocking layer with a donor impurity density lower than those of the first and the second hole blocking layers.

(14) The photoelectric conversion element according to (13), in which
the first and the second hole blocking layers are layers with a donor impurity density equal to or higher than 1e16/cm3, and
the third hole blocking layer is a layer with a donor impurity density lower than 1e16/cm3.

(15) The photoelectric conversion element according to (1), in which
the at least one charge blocking layer is configured of three electron blocking layers including a first and second electron blocking layers and a third electron blocking layer with an acceptor impurity density lower than those of the first and the second electron blocking layers.

(16) The photoelectric conversion element according to (15), in which
the first and the second electron blocking layers are layers with an acceptor impurity density equal to or higher than 1e16/cm3, and
the third electron blocking layer is a layer with an acceptor impurity density lower than 1e16/cm3.

(17) A measuring method of a photoelectric conversion element, the method including:
performing photoelectron spectrometry or inverse photoelectron spectrometry on an exposed surface while irradiating at least one charge blocking layer of a photoelectric conversion element with a gas cluster ion beam,
the photoelectric conversion element including:
two electrodes forming a positive electrode and a negative electrode;
the at least one charge blocking layer arranged between the two electrodes; and
a photoelectric conversion layer arranged between the two electrodes, in which
it is confirmed that
when the at least one charge blocking layer is an electron blocking layer,
positions X1, X2, and X3 are located at predetermined distances x1, x2, and x3 (x1<x2<x3) from an interface between the electron blocking layer and the negative electrode toward the photoelectric conversion layer, and absolute values $\Delta E(X1)$, $\Delta E(X2)$, and $\Delta E(X3)$ of a difference between an electron affinity Ea of the electron blocking layer and a work function WF of the negative electrode at each position satisfy a following formula (1), $$\Delta E(X2) > \Delta E(X1) \text{ and } \Delta E(X2) > \Delta E(X3) \tag{1}$$

and
when the at least one charge blocking layer is a hole blocking layer,
positions X1', X2', and X3' are located at predetermined distances x1', x2', and x3' (x1'<x2'<x3') from an interface between the hole blocking layer and the positive electrode toward the photoelectric conversion layer, and absolute values $\Delta E(X1')$, $\Delta E(X2')$, and $\Delta E(X3')$ of a difference between a work function WF of the positive electrode and an ionization potential Ip of the hole blocking layer at each position satisfy a following formula (2), $$\Delta E(X2') > \Delta E(X1') \text{ and } \Delta E(X2') > \Delta E(X3') \tag{2}$$

(18) A solid-state imaging device including:
a photoelectric conversion element including:
two electrodes forming a positive electrode and a negative electrode;
at least one charge blocking layer arranged between the two electrodes; and
a photoelectric conversion layer arranged between the two electrodes, in which
when the at least one charge blocking layer is an electron blocking layer,
positions X1, X2, and X3 are located at predetermined distances x1, x2, and x3 (x1<x2<x3) from an interface between the electron blocking layer and the negative electrode toward the photoelectric conversion layer, and absolute values $\Delta E(X1)$, $\Delta E(X2)$, and $\Delta E(X3)$ of a difference between an electron affinity Ea of the electron blocking layer and a work function WF of the negative electrode at each position satisfy a following formula (1), $$\Delta E(X2) > \Delta E(X1) \text{ and } \Delta E(X2) > \Delta E(X3) \tag{1}$$

and
when the at least one charge blocking layer is a hole blocking layer,
positions X1', X2', and X3' are located at predetermined distances x1', x2', and x3' (x1'<x2'<x3') from an interface between the hole blocking layer and the positive electrode toward the photoelectric conversion layer, and absolute values $\Delta E(X1')$, $\Delta E(X2')$, and $\Delta E(X3')$ of a difference between a work function WF of the positive electrode and an ionization potential Ip of the hole blocking layer at each position satisfy a following formula (2), $$\Delta E(X2') > \Delta E(X1') \text{ and } \Delta E(X2') > \Delta E(X3') \tag{2}$$

(19) An electronic device including a solid-state imaging device including:
a photoelectric conversion element including:
two electrodes forming a positive electrode and a negative electrode;
at least one charge blocking layer arranged between the two electrodes; and
a photoelectric conversion layer arranged between the two electrodes, in which
when the at least one charge blocking layer is an electron blocking layer,
positions X1, X2, and X3 are located at predetermined distances x1, x2, and x3 (x1<x2<x3) from an interface between the electron blocking layer and the negative electrode toward the photoelectric conversion layer, and absolute values $\Delta E(X1)$, $\Delta E(X2)$, and $\Delta E(X3)$ of a difference between an electron affinity Ea of the electron blocking layer and a work function WF of the negative electrode at each position satisfy a following formula (1), $$\Delta E(X2) > \Delta E(X1) \text{ and } \Delta E(X2) > \Delta E(X3) \tag{1}$$

and
when the at least one charge blocking layer is a hole blocking layer,
positions X1', X2', and X3' are located at predetermined distances x1', x2', and x3' (x1'<x2'<x3') from an interface between the hole blocking layer and the positive electrode toward the photoelectric conversion layer, and absolute values $\Delta E(X1')$, $\Delta E(X2')$, and $\Delta E(X3')$ of a difference between a work function WF of the positive electrode and an ionization potential Ip of the hole blocking layer at each position satisfy a following formula (2), $$\Delta E(X2') > \Delta E(X1') \text{ and } \Delta E(X2') > \Delta E(X3') \tag{2}$$

(20) A solar cell including:
two electrodes forming a positive electrode and a negative electrode;
at least one charge blocking layer arranged between the two electrodes; and
a photoelectric conversion layer arranged between the two electrodes, in which
when the at least one charge blocking layer is an electron blocking layer,
positions X1, X2, and X3 are located at predetermined distances x1, x2, and x3 (x1<x2<x3) from an interface between the electron blocking layer and the negative electrode toward the photoelectric conversion layer, and absolute values ΔE(X1), ΔE(X2), and ΔE(X3) of a difference between an electron affinity Ea of the electron blocking layer and a work function WF of the negative electrode at each position satisfy a following formula (1), $$\Delta E(X2) > \Delta E(X1) \text{ and } \Delta E(X2) > \Delta E(X3) \quad (1),$$

and when the at least one charge blocking layer is a hole blocking layer, positions X1', X2', and X3' are located at predetermined distances x1', x2', and x3' (x1'<x2'<x3') from an interface between the hole blocking layer and the positive electrode toward the photoelectric conversion layer, and absolute values ΔE(X1'), ΔE(X2'), and ΔE(X3') of a difference between a work function WF of the positive electrode and an ionization potential Ip of the hole blocking layer at each position satisfy a following formula (2), $$\Delta E(X2') > \Delta E(X1') \text{ and } \Delta E(X2') > \Delta E(X3') \quad (2)$$

REFERENCE SIGNS LIST 1 (1A to 1G) photoelectric conversion element
11 upper electrode (positive electrode)
12 photoelectric conversion layer
13, 13A to 13C electron blocking layer
14 lower electrode (negative electrode)
15, 15A to 15C hole blocking layer
31 solid-state imaging device
32 pixel
100 imaging device
102 solid-state imaging device

The invention claimed is:

1. A photoelectric conversion element, comprising:
a positive electrode;
a negative electrode;
at least one charge blocking layer arranged between the positive electrode and the negative electrode; and
a photoelectric conversion layer arranged between the positive electrode and the negative electrode, wherein
the at least one charge blocking layer is a hole blocking layer, positions X1', X2', and X3' are located at specific predetermined distances x1', x2', and x3', wherein x1', x2', and x3' satisfies a condition x1'<x2'<x3' from an interface between the hole blocking layer and the positive electrode toward the photoelectric conversion layer,
absolute values ΔE(X1'), ΔE(X2'), and ΔE(X3') of a difference between a work function WF of the positive electrode and an ionization potential Ip of the hole blocking layer at each position satisfy a following formula (2), $$\Delta E(X2') > \Delta E(X1') \text{ and } \Delta E(X2') > \Delta E(X3') \quad (2)$$

the hole blocking layer comprises a first hole blocking layer and a second hole blocking layer, and
a donor impurity density of the first hole blocking layer is different from that of a donor impurity density of the second hole blocking layer.

2. The photoelectric conversion element according to claim 1, wherein
the donor impurity density of the first hole blocking layer is one of equal to or higher than 1e16/cm3, and
the donor impurity density of the second hole blocking layer is lower than 1e16/cm3.

3. The photoelectric conversion element according to claim 2, wherein
the first hole blocking layer has contact with the positive electrode, and
the second hole blocking layer has contact with the photoelectric conversion layer.

4. The photoelectric conversion element according to claim 2, wherein
the first hole blocking layer has contact with the photoelectric conversion layer, and
the second hole blocking layer has contact with the positive electrode.

* * * * *